(12) United States Patent
Kim et al.

(10) Patent No.: US 10,629,125 B2
(45) Date of Patent: Apr. 21, 2020

(54) DISPLAY DEVICE

(71) Applicant: LG Display Co., Ltd., Seoul (KR)

(72) Inventors: Minsu Kim, Daegu (KR); Minseo Kim, Daegu (KR); Youngbin Woo, Daegu (KR)

(73) Assignee: LG Display Co., Ltd., Seoul (KR)

( * ) Notice: Subject to any disclaimer, the term of this patent is extended or adjusted under 35 U.S.C. 154(b) by 119 days.

(21) Appl. No.: 16/015,566

(22) Filed: Jun. 22, 2018

(65) Prior Publication Data
US 2019/0005885 A1   Jan. 3, 2019

(30) Foreign Application Priority Data

Jun. 30, 2017 (KR) .................. 10-2017-0083254
Jun. 30, 2017 (KR) .................. 10-2017-0083257

(51) Int. Cl.
*G09G 3/3258* (2016.01)
*H01L 27/12* (2006.01)
*H01L 29/786* (2006.01)

(52) U.S. Cl.
CPC ......... *G09G 3/3258* (2013.01); *H01L 27/124* (2013.01); *H01L 27/1218* (2013.01); *H01L 29/78609* (2013.01); *G09G 2300/0819* (2013.01); *H01L 29/78675* (2013.01)

(58) Field of Classification Search
CPC .......... G09G 3/3258; G09G 2300/0819; H01L 27/12; H01L 27/124; H01L 27/1218; H01L 29/78609; H01L 29/78675
See application file for complete search history.

(56) References Cited

U.S. PATENT DOCUMENTS

| | | | |
|---|---|---|---|
| 6,219,016 B1* | 4/2001 | Lee ................. | G09G 3/3648 345/87 |
| 8,497,817 B2* | 7/2013 | Jeong .............. | H04N 13/337 345/6 |
| 2008/0150859 A1* | 6/2008 | Song .............. | G09G 3/3648 345/87 |
| 2014/0267683 A1* | 9/2014 | Bibl ................ | H01L 51/50 348/87 |
| 2015/0317942 A1* | 11/2015 | Guo ................ | G09G 3/3696 345/211 |
| 2016/0086563 A1* | 3/2016 | Park ............... | G09G 3/3696 345/211 |
| 2016/0197232 A1* | 7/2016 | Bour ............... | H01L 33/24 257/13 |
| 2016/0315218 A1* | 10/2016 | Bour ............... | H01L 33/20 |

* cited by examiner

*Primary Examiner* — Ricardo Osorio
(74) *Attorney, Agent, or Firm* — Morgan, Lewis & Bockius LLP

(57) ABSTRACT

A display device includes a substrate including an active area having a plurality of pixels and a bezel area around the active area; a data driver on one side of the bezel area; a gate driver on at least one side of the bezel area; a shield power supply line extending from the data driver to at least one side of the gate driver; and a shield layer overlapped with at least one thin film transistor of the gate driver and connected to the shield power supply line in the bezel area.

19 Claims, 21 Drawing Sheets

DISPLAY DEVICE

This application claims the priority benefit of Korean Patent Application Nos. 10-2017-0083254 filed on Jun. 30, 2017, and 10-2017-0083257 filed on Jun. 30, 2017, which are incorporated herein by reference for all purposes as if fully set forth herein.

BACKGROUND

Technical Field

The present disclosure relates to a display device, and more particularly, to a display device capable of maintaining electrical characteristics of a thin film transistor, reducing a bezel area, and designing a high resolution pixel.

Discussion of the Related Art

As the information society has developed, the demand for display devices for displaying images has increased in various forms. The field of display devices has rapidly migrated to flat panel display (FPD) devices, which replaced the bulky cathode ray tube (CRT) devices because they are thin and light, with large screens. The flat panel display device includes a liquid crystal display (LCD), a plasma display panel (PDP), an organic light emitting display device, and an electrophoretic display (EPD) device.

Among these, the organic light emitting display device includes a self-emission element that emits light by itself, which has advantages of high response speed, high light emission efficiency, luminance, and large viewing angle. Particularly, the organic light emitting display device can be not only formed on a flexible plastic substrate, but also driven at a lower voltage than an inorganic electroluminescent (EL) display or a plasma display panel. The organic light emitting display device has advantages of low power consumption and excellent color.

The organic light emitting display device is roughly divided into a passive matrix type and an active matrix type. In the active matrix type organic light emitting display device, thin film transistors allocated in pixels arranged in a matrix manner are disposed. Further, a gate driver for applying a signal to the thin film transistors is disposed in a bezel area other than an active area where an image is displayed. The gate driver is composed of a plurality of thin film transistors.

The thin film transistor includes an active layer and a gate electrode disposed opposite each other with a gate insulating layer interposed therebetween on a substrate, and includes a source electrode and a drain electrode respectively connected to the active layer. The thin film transistor operates on the principle of turning on/off by controlling carriers moving to a channel of the active layer through the source electrode and the drain electrode depending on a voltage of the gate electrode. Therefore, the thin film transistor has a problem that characteristics of the thin film transistor may change because the thin film transistor is easily affected by the surrounding voltage or static electricity.

SUMMARY

Accordingly, embodiments of the present disclosure are directed to a display device that substantially obviates one or more of the problems due to limitations and disadvantages of the related art.

An aspect of the present disclosure is to provide a display device capable of maintaining electrical characteristics of a thin film transistor, reducing a bezel area, and designing a high resolution pixel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate including an active area having a plurality of pixels and a bezel area around the active area; a data driver on one side of the bezel area; a gate driver on at least one side of the bezel area; a shield power supply line extending from the data driver to at least one side of the gate driver; and a shield layer overlapped with at least one thin film transistor of the gate driver and connected to the shield power supply line in the bezel area.

In another aspect, a display device comprises a substrate including an active area having a plurality of pixels and a bezel area around the active area; a gate driver on the bezel area of the substrate and including a plurality of thin film transistors; a shield layer between the substrate and the plurality of thin film transistors; and a shield power supply line on the bezel area of the substrate, wherein the shield layer is connected to the shield power supply line in the bezel area of the substrate.

In another aspect, a display device comprises a substrate including an active area having a plurality of pixels and a bezel area around the active area; a data driver on one side of the bezel area; a shield power supply line extending from the data driver to at least one side of the active area; and a shield layer overlapped with the active area and connected to the shield power supply line, wherein the shield layer overlaps with at least one thin film transistor of each of the plurality of pixels.

In another aspect, a display device comprises a substrate including an active area having a plurality of pixels and a bezel area around the active area; at least one thin film transistor on the active area of the substrate and in each of the plurality of pixels; a shield layer between the substrate and the at least one thin film transistor; and a shield power supply line on the bezel area of the substrate, wherein the shield layer is connected to the shield power supply line in the bezel area.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
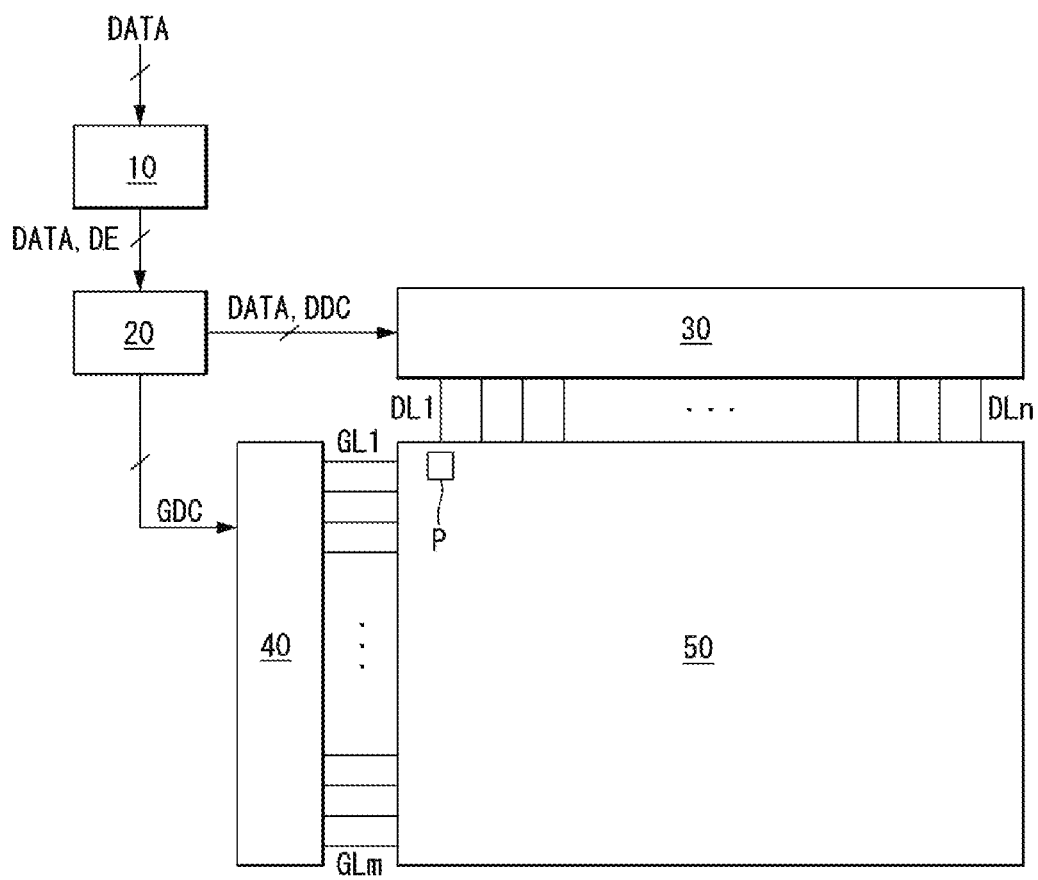
FIG. 1 is a schematic block diagram of an organic light emitting display device.

Hereinafter, example embodiments of the present disclosure will be described with reference to the accompanying drawings. Like reference numerals designate like elements throughout the description. In the following description, when a detailed description of well-known functions or configurations related to this document is determined to unnecessarily cloud a gist of the invention, the detailed description thereof will be omitted. In addition, component names used in the following description may be selected in consideration of easiness of specification, and may be different from the parts names of actual products. In the description of positional relationship, when a structure is described as being positioned "on or above," "under or below," or "next to" another structure, this description should be construed as including a case in which the structures contact each other as well as a case in which a third structure is disposed therebetween unless "right" or "direct" or "in contact with" is used together.

A display device according to an embodiment of the present disclosure may be an organic light emitting display device, a liquid crystal display, an electrophoretic display device, or the like. In the present disclosure, the organic light emitting display device will be described as an example. The organic light emitting display device includes a light emitting layer made of an organic material between a first electrode and a second electrode. The organic light emitting display device is a self light emitting display in which a hole supplied from the first electrode and an electron supplied from the second electrode are combined in the light emitting layer to form an exciton which is a hole-electron pair, and the exciton emits light by energy generated by returning to the ground state.

In a thin film transistor according to the present disclosure, an active layer may be made of a polycrystalline semiconductor material or an oxide semiconductor material. Because the polycrystalline semiconductor material has high mobility (100 $cm^2$/Vs or more), low power consumption and excellent reliability, it may be applied to a gate driver and/or a multiplexer (MUX) for a driving element for driving the thin film transistor. Alternatively, the polycrystalline semiconductor material may be applied to a driving thin film transistor in a pixel of the organic light emitting display device. Because the oxide semiconductor material has a low off-current, it is suitable for a switching thin film transistor which has a short on time and a long off time. Alternatively, because the off-current of the oxide semiconductor material is low, and a voltage holding period of the pixel is long, the oxide semiconductor material is suitable for a display device requiring low refresh and/or low power consumption. In the present disclosure, the driving thin film transistor including the polycrystalline semiconductor material is described as an example. However, the present disclosure is not limited thereto, and the switching thin film transistor other than the driving thin film transistor may be used.

Hereinafter, example embodiments of the present disclosure will be described with reference to the accompanying drawings.

Figure 2:
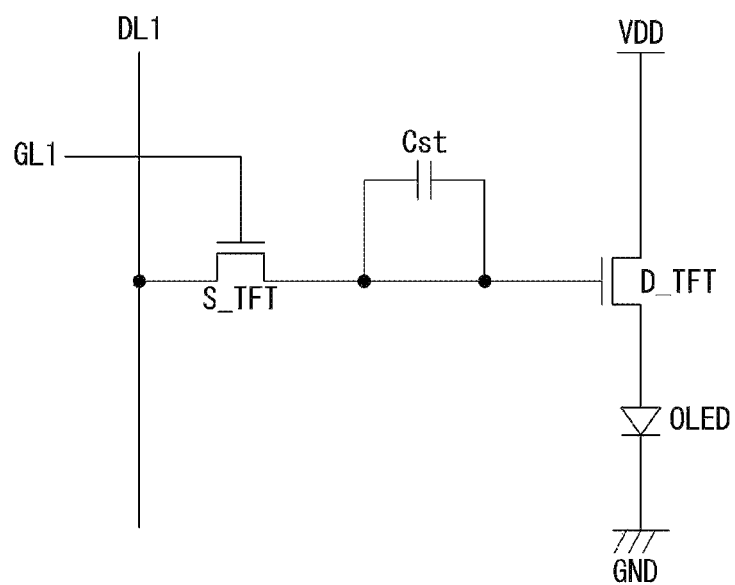
FIG. 2 is a first exemplary view showing a circuit configuration of a pixel.
Figure 3:
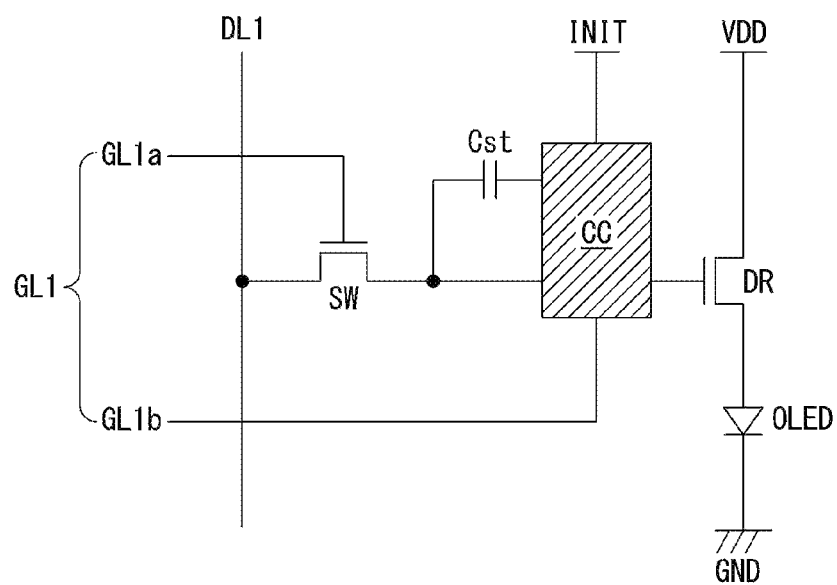
FIG. 3 is a second exemplary view showing a circuit configuration of a pixel.
Figure 4:
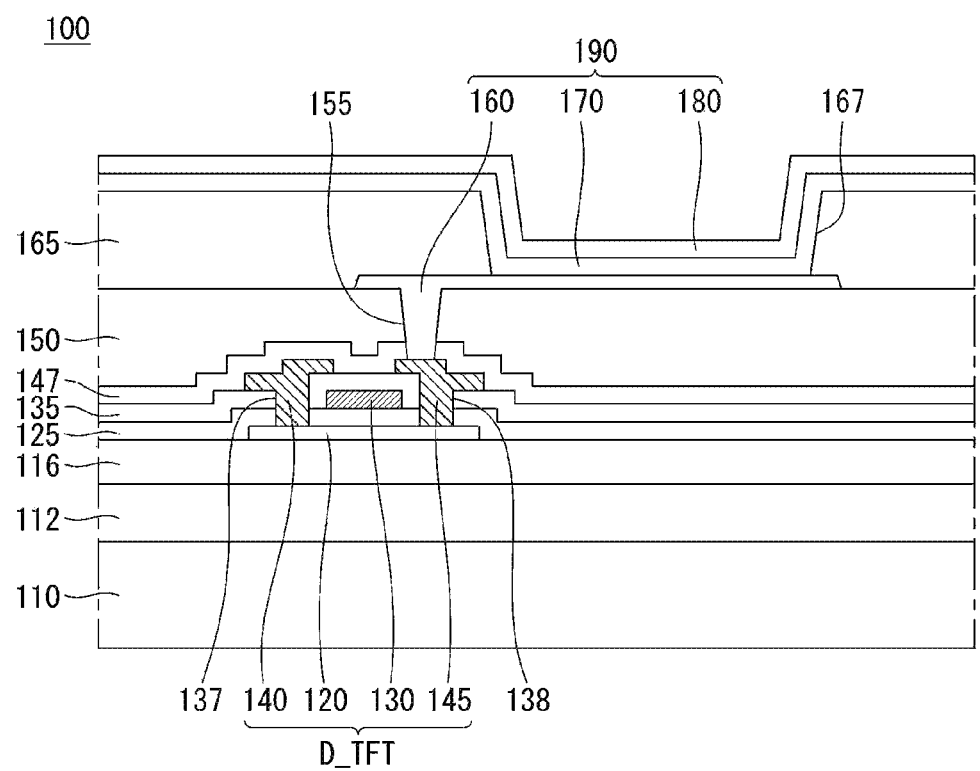
FIG. 4 is a cross-sectional view showing a structure of a pixel of an organic light emitting display device according to an example of the present disclosure.

FIG. 1 is a schematic block diagram of an organic light emitting display device. FIG. 2 is a first exemplary view showing a circuit configuration of a pixel. FIG. 3 is a second exemplary view showing a circuit configuration of a pixel. FIG. 4 is a cross-sectional view showing a structure of a pixel.

With reference to FIG. 1, the organic light emitting display device may include an image processor 10, a timing controller 20, a data driver 30, a gate driver 40, and a display panel 50.

The image processor 10 outputs a data enable signal DE together with a data signal DATA supplied from the outside. The image processor 10 may output at least one of a vertical synchronization signal, a horizontal synchronization signal, and a clock signal in addition to the data enable signal DE, but these signals are omitted for convenience of explanation. The image processor 10 is formed on a system circuit board in a form of an integrated circuit (IC).

The timing controller 20 receives the data signal DATA together with the data enable signal DE or a driving signal including the vertical synchronization signal, the horizontal synchronization signal, and the clock signal from the image processor 10. The timing controller 20 generates a gate timing control signal GDC for controlling operation timing of the gate driver 40 and a data timing control signal DDC for controlling operation timing of the data driver 30 based on the driving signal. The timing controller 20 is formed on a control circuit board in a form of an IC.

The data driver 30 samples and latches the data signal DATA supplied from the timing controller 20 in response to the data timing control signal DDC supplied from the timing controller 20 and converts the sampled data signal into a gamma reference voltage and outputs it. The data driver 30 outputs the data signal DATA through data lines DL1 to DLn. The data driver 30 is mounted on a substrate in a form of an IC.

The gate driver 40 outputs a gate signal while shifting a level of a gate voltage in response to the gate timing control signal GDC supplied from the timing controller 20. The gate driver 40 outputs the gate signal through gate lines GL1 to GLm. The gate driver 40 is formed on a gate circuit board in a form of an IC or is formed on the display panel 50 in a gate in panel (GIP) manner.

The display panel 50 displays an image corresponding to the data signal DATA and the gate signal supplied from the data driver 30 and the gate driver 40. The display panel 50 includes pixels P for displaying the image.

In FIG. 2, one pixel includes a switching thin film transistor S_TFT, a driving thin film transistor D_TFT, and an organic light emitting diode OLED. The organic light emitting diode OLED operates to emit light depending on a driving current formed by the driving thin film transistor D_TFT.

The switching thin film transistor S_TFT is switched so that a data signal supplied through a first data line DL1 is stored as a data voltage in a capacitor Cst in response to a gate signal supplied through a first gate line GL1. The driving thin film transistor D_TFT operates so that the driving current flows between a high level power supply line VDD and a low level power supply line GND depending on the data voltage stored in the capacitor Cst. Although not shown, it may further include a compensation circuit. The compensation circuit is a circuit for compensating a threshold voltage of the driving thin film transistor D_TFT. In addition, the capacitor Cst connected to the switching thin film transistor S_TFT or the driving thin film transistor D_TFT may be positioned inside the compensation circuit. The compensation circuit may be composed of one or more thin film transistors and capacitor, but the circuit is not particularly limited to those configurations.

Further, as shown in FIG. 3, when a compensation circuit CC is included, a pixel further includes a signal line and a power supply line for driving a compensating thin film transistor and supplying a specific signal or power. The added signal line may be defined as a 1a and 1b gate line GL1a, GL1b for driving the compensating thin film transistor included in the pixel. The added power supply line may be defined as an initialization power supply line INIT for initializing a specific node of the pixel as a specific voltage. However, this is merely one example, and the present disclosure is not limited thereto.

On the other hand, FIG. 3 shows an example in which the compensation circuit CC is included in one pixel. However, when a subject of compensation is positioned outside the pixel, such as the data driver 30, the compensation circuit CC may be omitted. For example, one pixel may be basically composed of a 2T (Transistor) 1C (Capacitor) structure including the switching thin film transistor S_TFT, the driving thin film transistor D_TFT, the capacitor and the organic light emitting diode OLED. However, when the compensation circuit CC is added, one pixel may be variously composed of 3T1C, 4T2C, 5T2C, 6T2C, 7T1C, 7T2C, and the like.

Further, in FIG. 3, although the compensation circuit CC is shown as being positioned between the switching thin film transistor S_TFT and the driving thin film transistor D_TFT, the compensation circuit CC may be further positioned between the driving thin film transistor D_TFT and the organic light emitting diode OLED. The position and structure of the compensation circuit CC are not limited to that shown in FIG. 3.

Hereinafter, with reference to FIG. 4 of the present disclosure, a cross-sectional structure of a pixel P of an organic light emitting display device will be described.

In FIG. 4, in the organic light emitting display device 100 according to an embodiment of the present disclosure, a driving thin film transistor D_TFT and an organic light emitting diode 190 connected to the driving thin film transistor D_TFT are positioned on a substrate 110. Here, the substrate 110 may be made of glass, plastic or metal. In one example, the substrate 110 is made of plastic, and may be a polyimide substrate. Therefore, the substrate 110 would be flexible. A first buffer layer 112 is positioned on the substrate 110. The first buffer layer 112 protects a thin film transistor formed in a subsequent process from impurities, such as alkali ions or the like, that flow out from the substrate 110. The first buffer layer 112 may be a silicon oxide layer (SiOx), a silicon nitride layer (SiNx), or a multilayer thereof. A second buffer layer 116 is positioned on the first buffer layer 112. The second buffer layer 116 also protects the thin film transistor formed in the subsequent process from impurities, such as alkali ions or the like, that flow out from a lower portion like the first buffer layer 112. The second buffer layer 116 may be a silicon oxide layer (SiOx), a silicon nitride layer (SiNx), or a multilayer thereof.

An active layer 120 is positioned on the second buffer layer 116. The active layer 120 may be formed of a silicon semiconductor or an oxide semiconductor. The silicon semiconductor may include amorphous silicon or crystallized polycrystalline silicon, and may be the active layer 120 made of oxide in this embodiment. The active layer 120 includes a source region, a drain region, a channel region positioned therebetween, and the like. The source region and the drain region are regions where the impurities are doped with a high concentration, and a source electrode and a drain electrode of the thin film transistor are respectively connected. The impurity ion may be a p-type impurity or an n-type impurity. The p-type impurity may be selected from a group consisting of boron (B), aluminum (Al), gallium (Ga), and indium (In). The n-type impurity may be selected from a group consisting of phosphorus (P), arsenic (As) and antimony (Sb). The channel region of the active layer 120 may be doped with the n-type impurity or the p-type impurity depending on a structure of an NMOS or a PMOS thin film transistor. The thin film transistor according to examples of the present disclosure may be the NMOS or PMOS thin film transistor.

A first insulating layer 125, which may be a gate insulating layer, is positioned on the active layer 120. The first insulating layer 125 may be a silicon oxide layer (SiOx), a silicon nitride layer (SiNx), or a multilayer thereof. A gate electrode 130 is positioned on the first insulating layer 125 at a position corresponding to a certain region of the active layer 120, for example, a channel region. The gate electrode 130 is formed of any one selected from a group consisting of molybdenum (Mo), aluminum (Al), chromium (Cr), gold (Au), titanium (Ti), nickel (Ni), neodymium (Nd), and copper (Cu) or an alloy thereof. Further, the gate electrode 130 may be a multilayer made of any one selected from a group consisting of molybdenum (Mo), aluminum (Al), chromium (Cr), gold (Au), titanium (Ti), nickel (Ni), neodymium (Nd), and copper (Cu) or an alloy thereof. For example, the gate electrode 130 may be a double layer of molybdenum/aluminum-neodymium or/aluminum.

A second insulating layer 135, which may be an interlayer insulating layer, is positioned on the gate electrode 130. The second insulating layer 135 may be a silicon oxide layer (SiOx), a silicon nitride layer (SiNx), or a multilayer thereof. A part of the second insulating layer 135 and the first insulating layer 125 are etched to form contact holes 137 and 138 exposing a part of the active layer 120, for example, the source region and the drain region. A source electrode 140, and a drain electrode 145 are positioned on the second insulating layer 135. The source electrode 140 and the drain electrode 145 are electrically connected to the active layer 120 through the contact holes 137 and 138 passing through the second insulating layer 135 and the first insulating layer 125.

The source electrode 140 and the drain electrode 145 may be formed of a single layer or a multilayer. When the source electrode 140 and the drain electrode 145 are the single layer, the source electrode 140 and the drain electrode 145 may be formed of any one selected from a group consisting of Mo, Al, Cr, Au, Ti, Ni, Nd, Cu, or an alloy thereof. When the source electrode 140 and the drain electrode 145 are the multilayer, the source electrode 140 and the drain electrode 145 may be formed of a double layer of molybdenum/aluminum-neodymium, or a triple layer of titanium/aluminum/titanium, molybdenum/aluminum/molybdenum or molybdenum aluminum-neodymium/molybdenum. Therefore, a driving thin film transistor D_TFT including the active layer 120, the gate electrode 130, the source electrode 140, and the drain electrode 145 is formed.

A third insulating layer 147 is positioned on an entire surface of the substrate 110 including the driving thin film transistor D_TFT. The third insulating layer 147 is a passivation layer for protecting the underlying thin film transistors, and may be a silicon oxide layer (SiOx), a silicon nitride layer (SiNx), or a multilayer thereof. A fourth insulating layer 150 is positioned on an entire surface of the substrate 110 including the third insulating layer 147. The fourth insulating layer 150 may be a planarization layer for smoothing a stepped portion of the underlying structure and may be formed of an organic material such as polyimide, benzocyclobutene series resin, or acrylate. The third and fourth insulating layers 147 and 150 include a via hole 155 for exposing the drain electrode 145 of the driving thin film transistor D_TFT.

A first electrode 160 is positioned on the fourth insulating layer 150. The first electrode 160 may be an anode, and may be made of a transparent conductive material such as indium tin oxide (ITO), indium zinc oxide (IZO), or zinc oxide (ZnO). The first electrode 160 fills the via hole 155 and is connected to the drain electrode 145 of the driving thin film transistor D_TFT. Here, when the organic light emitting display device 100 has a top emission structure in which light is emitted toward a second electrode 180, the first electrode 160 may further include a reflective layer and may have a two-layer structure of ITO/reflective layer or a three-layer structure of ITO/reflective layer/ITO. On the other hand, when the organic light emitting display device 100 has a bottom emission structure in which light is emitted toward the first electrode 160, the first electrode 160 may be made of only the transparent conductive material.

A bank layer 165 is positioned on the substrate 110 including the first electrode 160. The bank layer 165 may be a pixel defining layer which defines a pixel by exposing a part of the first electrode 160. The bank layer 165 is made of an organic material such as polyimide, benzocyclobutene series resin, or acrylate. The bank layer 165 is provided with an opening 167 through which the first electrode 160 is exposed.

An organic layer 170 is positioned on the first electrode 160 exposed by the opening 167 of the bank layer 165. The organic layer 170 may include at least a light emitting layer in which electrons and holes are combined to emit light, and at least one of a hole injection layer, a hole transport layer, an electron transport layer, and an electron injection layer.

A second electrode 180 is positioned on the substrate 110 on which the organic layer 170 is formed. The second electrode 180 may be made of magnesium (Mg), calcium (Ca), aluminum (Al), silver (Ag), or an alloy thereof having a low work function as a cathode electrode. When the organic light emitting display device 100 of the present disclosure has a top emission structure in which light is emitted toward the second electrode 180, the second electrode 180 is thin enough to allow light to pass therethrough. In contrast, when the organic light emitting display device 100 of the present disclosure is has a bottom emission structure in which light is emitted toward the first electrode 160, the second electrode 180 is thick enough to reflect light. Accordingly, the organic light emitting display device 100 of the present disclosure is formed by configuring the organic light emitting diode 190 including the first electrode 160, the organic layer 170, and the second electrode 180.

Hereinafter, an organic light emitting display device according to embodiments of the present disclosure will be described.

First Embodiment

Figure 5:
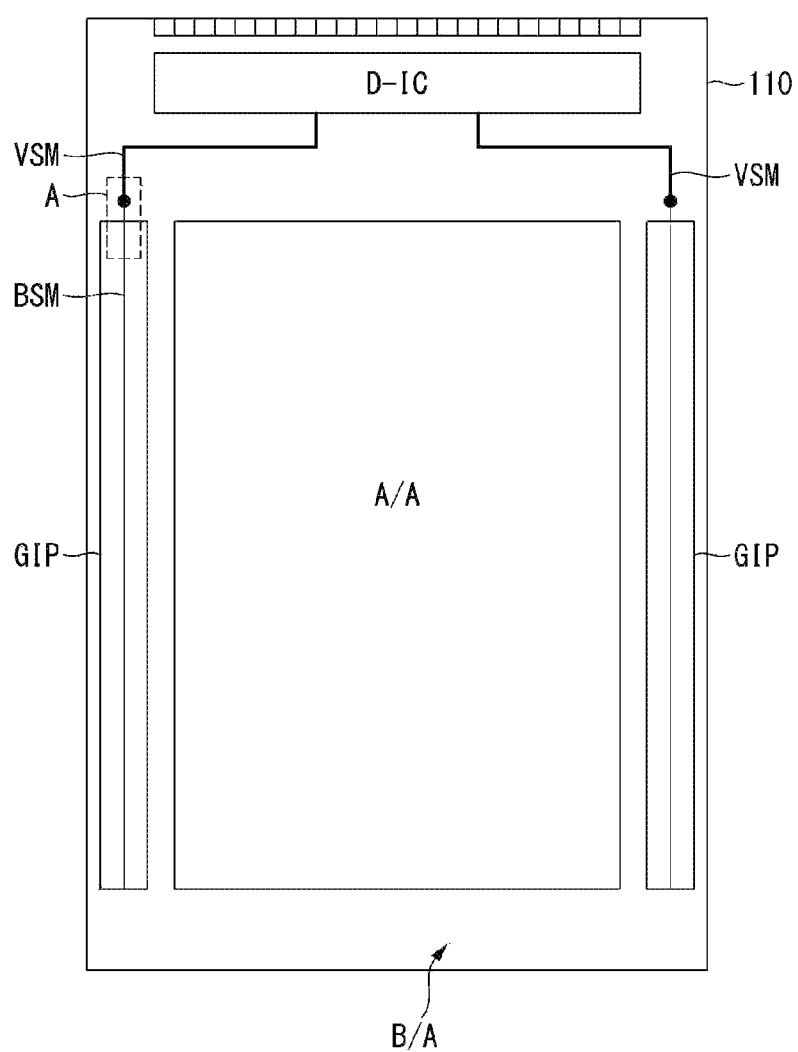
FIG. 5 is a plan view of an organic light emitting display device according to a first embodiment of the present disclosure.
Figure 6:
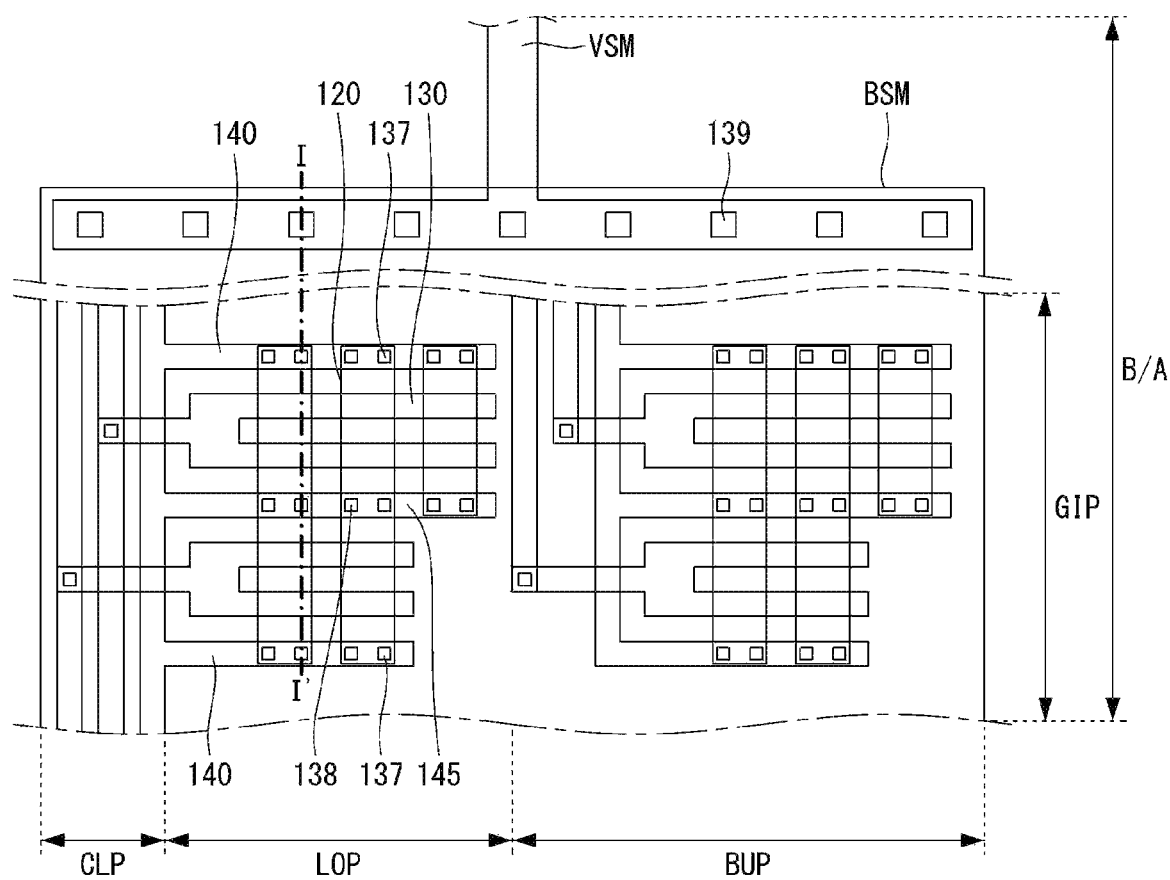
FIG. 6 is an enlarged plan view of area A in FIG. 5.
Figure 7:
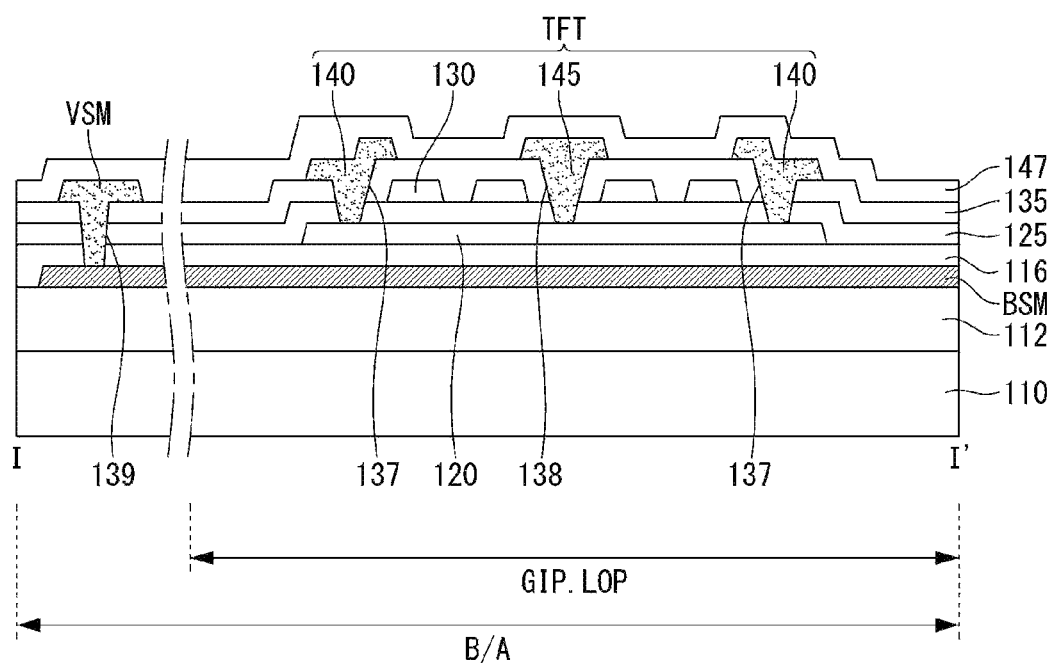
FIG. 7 is a cross-sectional view taken along line I-I' of FIG. 6.

FIG. 5 is a plan view of an organic light emitting display device according to a first embodiment of the present disclosure. FIG. 6 is an enlarged plan view of an area A in FIG. 5. FIG. 7 is a cross-sectional view taken along line I-I' of FIG. 6.

As illustrated in FIG. 5, an organic light emitting display device 100 includes an active area A/A that implements an image on a substrate 110 and a bezel area B/A that surrounds the active area A/A. A plurality of pixels P are disposed in the active area A/A to emit light of red (R), green (G), and blue (B) to realize full color. The plurality of pixels P may be provided as cyan, magenta, and yellow pixels, and any known pixel structure is applicable. The plurality of pixels P may be disposed in a stripe manner in which red (R), green (G) and blue (B) are disposed in order on one row. The plurality of pixels P may be disposed such that red (R) is disposed in one row, green (G) is disposed in the next row, and blue (B) is disposed in the next row of the green pixel. Further, one (or more) of the red (R), green (G), or blue (B) may be formed of two subpixels. Also, the plurality of pixels P may be disposed in a pentile manner. The bezel area B/A is an area surrounding the active area A/A and is an area where light is not emitted. The bezel area B/A may include a gate driver GIP, a data driver D-IC, and the like for driving elements for driving the pixels P in the active area A/A.

A shield power supply line VSM for applying power from the data driver D-IC to a shield layer BSM is positioned on one side of the gate driver GIP. The shield power supply line VSM extends from the data driver D-IC and is disposed on one side of the gate driver GIP, and is connected to the shield layer BSM in the bezel area B/A, respectively.

The shield layer BSM is disposed in the bezel area B/A, and is disposed to overlap with a plurality of thin film transistors of the gate driver GIP. The shield layer BSM is supplied with power from the above-described shield power supply line VSM, and prevents electrical characteristics of the thin film transistors of the gate driver GIP from being changed. More specific operations will be described later. The shield layer BSM is formed in a single line shape disposed in a longitudinal direction and disposed to overlap with an entire gate driver GIP. For example, as shown in FIG. 5, when one gate driver GIP may be disposed on both sides of the active area A/A, the shield power supply line VSM is also disposed on both sides corresponding to the gate driver GIP, and the shield layer BSM is also disposed on both sides. Here, although the shield layer BSM is shown as one line in FIG. 5 for convenience of explanation, the shield layer BSM overlaps with all the thin film transistors disposed in the gate driver GIP.

More specifically, disposition of the shield layer BSM and the shield power supply line VSM will be described with reference to FIG. 6. As shown in FIG. 6, the organic light emitting display device 100 includes the gate driver GIP disposed in the bezel area B/A. The gate driver GIP of the present disclosure may be divided into a buffer part BUP, a logic part LOP, and a clock part CLP as a scan signal generator. The buffer part BUP is composed of a plurality of thin film transistors, and outputs a scan signal depending on a scan clock applied to a clock input terminal of the clock part CLP in response to a node voltage. The logic part LOP is also composed of a plurality of thin film transistors, and receives a start pulse or a carry signal to precharge a Q node and control the Q node. The clock part CLP is composed of a plurality of wirings, and transmits clocks and a start signal input under control of a timing controller to the buffer part BUP and the logic part LOP of the gate driver GIP. The buffer part BUP and the logic part LOP are composed of the plurality of thin film transistors (TFT). For example, a thin film transistor TFT of the logic part LOP is composed of an active layer 120, a gate electrode 130, a source electrode 140 and a drain electrode 145 connected to the active layer 120.

On the other hand, the shield power supply line VSM is positioned in the bezel area B/A other than the gate driver GIP, and the shield layer BSM is positioned in the gate driver GIP and the bezel area B/A other than the gate driver GIP. The shield power supply line VSM is disposed on one side of the gate driver GIP, and connected to the shield layer BSM through a through hole 139 in the bezel area B/A other than the gate driver GIP, respectively.

The shield layer BSM is disposed in the bezel area B/A including the gate driver GIP, and overlaps with the gate driver GIP. Specifically, the shield layer BSM overlaps with all of the clock part CLP, the logic part LOP and the buffer part BUP of the gate driver GIP. An external electric field affects the plurality of thin film transistors (TFTs) disposed in the logic part LOP and the buffer part BUP to change characteristics of the thin film transistors (TFTs). Therefore, the shield layer BSM can prevent the characteristics of the thin film transistors (TFTs) from being changed.

Hereinafter, the organic light emitting display device of the present disclosure will be described in detail with reference to FIG. 7, which is a cross-sectional view showing a structure taken along line I-I' of FIG. 6. Hereinafter, a cross-sectional structure of the shield layer BSM and the thin film transistor TFT will be described taking the logic part LOP of the gate driver GIP as an example. The same components as those of the thin film transistor of FIG. 4 described above are denoted by the same reference numerals, and a description thereof will be simplified.

As shown in FIG. 7, in the organic light emitting display device 100, the shield layer BSM and the thin film transistor TFT may be positioned in the logic part LOP on the substrate 110. Here, a first buffer layer 112 is positioned on the substrate 110 and the shield layer BSM is positioned on the first buffer layer 112. The shield layer BSM is formed of a conductive material. For example, the shield layer BSM may be formed of any one selected from a group consisting of Mo, Al, Cr, Au, Ti, Ni, Nd, Cu, or a metal, such as an alloy thereof, or a semiconductor, such as silicon (Si). The shield layer BSM is positioned in the bezel area B/A including the gate driver GIP.

A second buffer layer 116 is positioned on the shield layer BSM and an active layer 120 is positioned on the second buffer layer 116. A first insulating layer 125 is positioned on the active layer 120 and a gate electrode 130 is positioned on the first insulating layer 125 at a position corresponding to a certain region of the active layer 120, for example, a channel region. A second insulating layer 135 is positioned on the gate electrode 130 and a part of the second insulating layer 135 and the first insulating layer 125 are etched to form contact holes 137 and 138 exposing a part of the active layer 120, for example, a source region and a drain region. A data line DL, a source electrode 140, and a drain electrode 145 are positioned on the second insulating layer 135. Therefore, a thin film transistor (TFT) including the active layer 120, the gate electrode 130, the source electrode 140, and the drain electrode 145 is formed.

In the bezel area B/A, a shield power supply line VSM is positioned on the second insulating layer 135. The shield power supply line VSM is connected to the shield layer BSM through a through hole 139 passing through the second buffer layer 116, the first insulating layer 125 and the second insulating layer 135. In this example embodiment, the shield power supply line VSM is positioned in the same layer as the source electrode 140, but the shield power supply line VSM may be positioned in the same layer as the gate electrode 130. A third insulating layer 147 is positioned on an entire surface of the substrate 110 including the thin film transistor TFT and the shield power supply line VSM.

When power is applied to the shield layer BSM in the gate driver GIP of the organic light emitting display device 100, it is possible to prevent the characteristics of the thin film transistors (TFTs) from being changed by shielding an electric field formed by the polyimide substrate 110 under the active layer 120. Unlike applying an external power to the shield layer as in the present disclosure, as another method of applying power to the shield layer, there is a method of connecting the source electrode of the thin film transistor and the shield layer and applying the source power to the shield layer. However, depending on a voltage applied to the source electrode, a difference in a voltage between the source electrode and the gate electrode occurs. In an example according to the present disclosure, power is applied to the shield layer BSM from the data driver D-IC instead of connecting the source electrode 140 and the shield layer BSM to prevent occurrence of the difference in the voltage between the source electrode 140 and the gate electrode 130 from occurring.

Further, in a structure for connecting the source electrode of the thin film transistor and the shield layer, because a through hole connecting the source electrode and the shield layer is formed in the pixel, a size of the gate driver GIP is increased by a size of the through hole. However, according to the present disclosure, the shield power supply line VSM is connected to the shield layer BSM through the through hole 139 in the outside of the gate driver GIP, so that the size of the gate driver GIP can be reduced and the number of the through holes can be remarkably reduced, thereby reducing a size of the bezel area.

Further, in the structure for connecting the source electrode of the thin film transistor and the shield layer, because the voltage applied to the source electrode is limited, a voltage applied to the shield layer cannot be adjusted. However, because the power may be applied from the data driver D-IC, the voltage applied to the shield layer can be adjusted in response to the structure or the model or the panel characteristics of the NMOS or PMOS thin film transistor. Therefore, the characteristics of the thin film transistor can be improved.

Although the gate driver GIP includes only the scan signal generator in the above-described embodiment of the present disclosure, the present disclosure is not limited thereto and may include an emission signal generator. The emission signal generator also, like the above-described scan signal generator, includes a clock part, a logic part, and a buffer part, and the shield layer of the present disclosure can be equally applied.

On the other hand, the shield layer BSM of the present disclosure may be formed in a different structure in the gate driver GIP. Hereinafter, another structure of the shield layer BSM will be described with reference to a second embodiment and a third embodiment. In the following description, the same reference numerals are assigned to the same components as those in the first embodiment, and a description thereof will be omitted.

Second Embodiment

Figure 8:
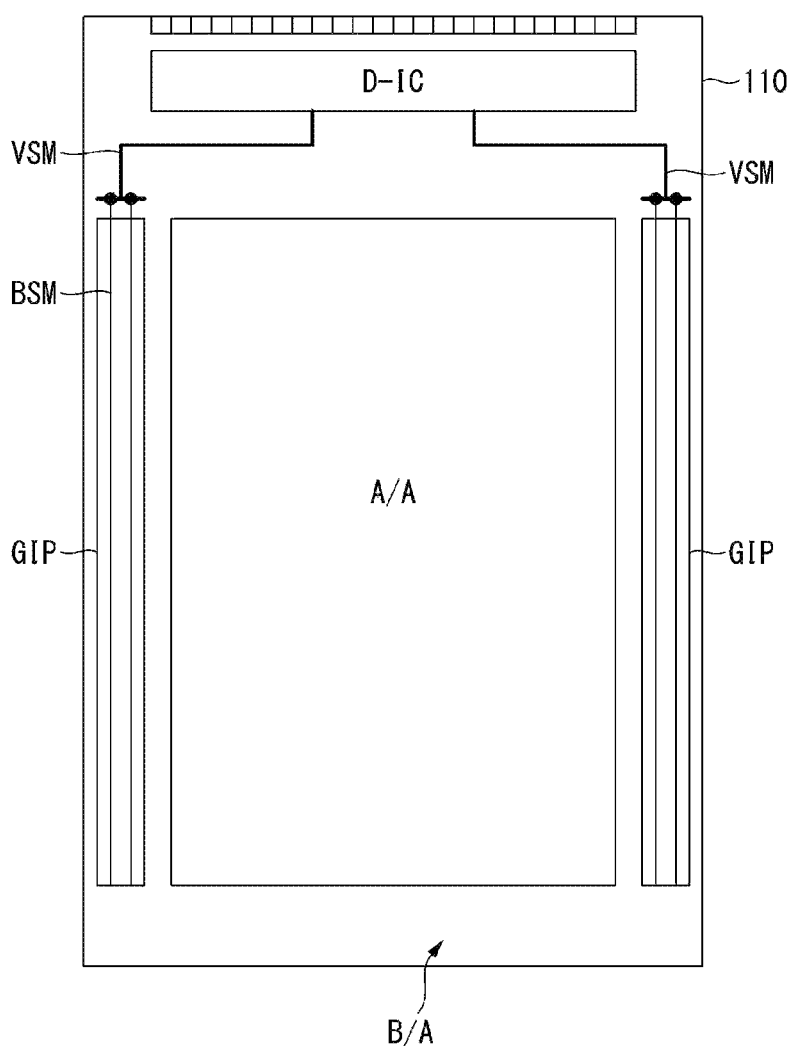
FIG. 8 is a plan view of an organic light emitting display device according to a second embodiment of the present disclosure.
Figure 9:
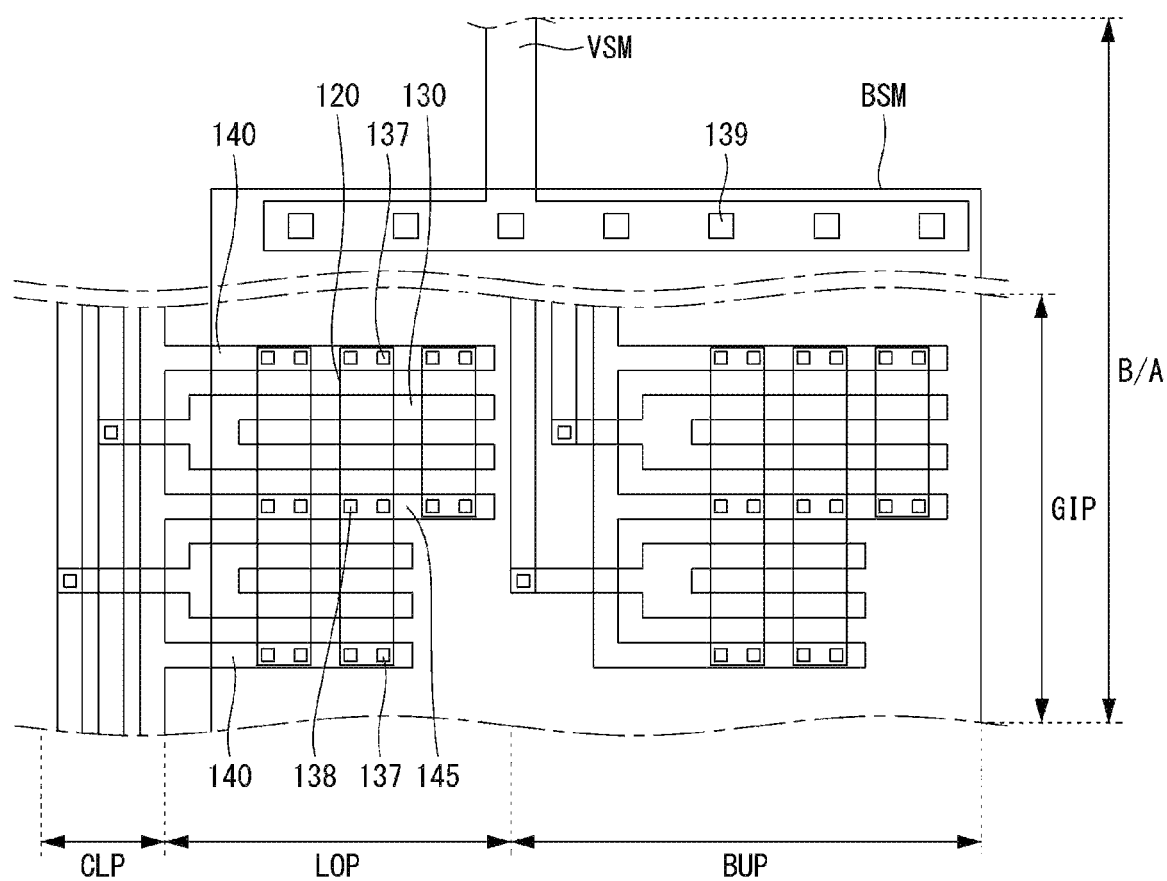
FIG. 9 is an enlarged plan view of a gate driver shown in FIG. 8.

FIG. 8 is a plan view of an organic light emitting display device according to a second embodiment of the present disclosure. FIG. 9 is an enlarged plan view of a gate driver shown in FIG. 8.

In FIG. 8, an organic light emitting display device 100 includes an active area A/A that implements an image on a substrate 110 and a bezel area B/A that surrounds the active area A/A. The bezel region B/A may include a gate driver GIP, a data driver D-IC, and the like for driving elements for driving pixels P in the active area A/A.

A shield power supply line VSM for applying power from the data driver D-IC to a shield layer BSM is positioned on one side of the gate driver GIP. The shield power supply line VSM extends from the data driver D-IC and is disposed on one side of the gate driver GIP, and is connected to the shield layer BSM in the bezel area B/A, respectively.

The shield layer BSM is disposed in the bezel area B/A, and is disposed to overlap with a plurality of thin film transistors of the gate driver GIP. The shield layer BSM is formed in a plurality of line shapes disposed in a longitudinal direction and disposed to overlap with an entire gate driver GIP. For example, as shown in FIG. 8, when one gate driver GIP is disposed on both side of the active area A/A, respectively, the shield power supply line VSM is also disposed on both sides corresponding to the gate driver GIP, and two shield layer BSM are disposed on each gate driver GIP.

The disposition of the shield layer BSM and the shield power supply line VSM will be described with reference to FIG. 9. In FIG. 9, the organic light emitting display device 100 includes the gate driver GIP disposed in the bezel area B/A. The gate driver GIP may be divided into a buffer part BUP, a logic part LOP, and a clock part CLP as a scan signal generator. The shield power supply line VSM is positioned on the bezel area B/A other than the gate driver GIP, and the shield layer BSM is positioned in the gate driver GIP and the bezel area B/A other than the gate driver GIP. The shield power supply line VSM is disposed on one side of the gate driver GIP, and connected to the shield layer BSM through a through hole 139 in the bezel area B/A other than the gate driver GIP, respectively.

The shield layer BSM is disposed in the bezel area B/A including the gate driver GIP, and overlaps with the gate driver GIP. Specifically, the shield layer BSM overlaps with the logic part LOP and the buffer part BUP except for the clock part CLP of the gate driver GIP. When the shield layer BSM exists under the clock part CLP, a parasitic capacitor is formed between wirings of the clock part CLP and the shield layer BSM, and a voltage of the shield layer BSM can be varied by coupling effect depending on a voltage applied to the clock part CLP. Therefore, in this embodiment, the shield layer BSM is formed to not overlap with the clock part CLP to prevent variation of the voltage of the shield layer BSM and to prevent formation of the parasitic capacitor. In addition, because the thin film transistors (TFTs) of the logic part LOP and the buffer part BUP are overlapped with the shield layer BSM, similar effects as those of the above-described first embodiment can be obtained.

Third Embodiment

Figure 10:
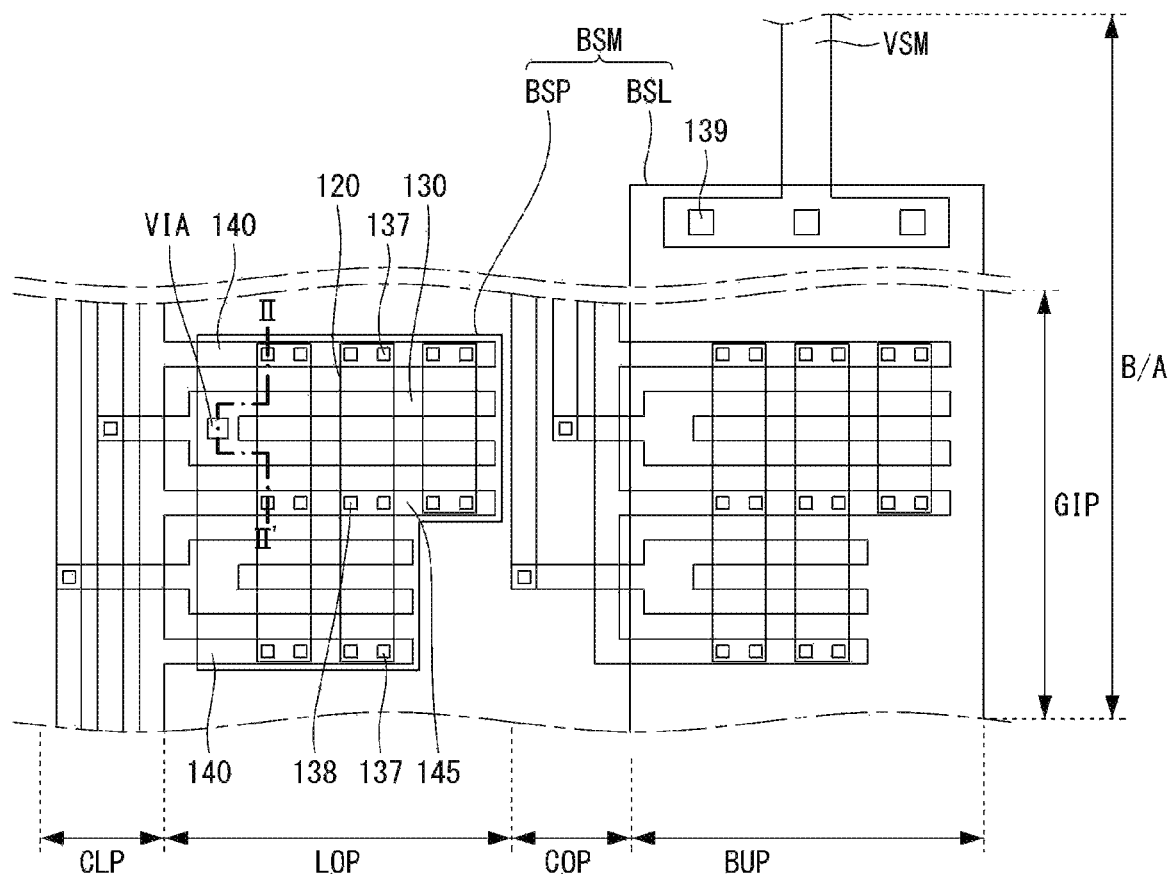
FIG. 10 is an enlarged view of a part of an organic light emitting display device according to a third embodiment of the present disclosure.
Figure 11:
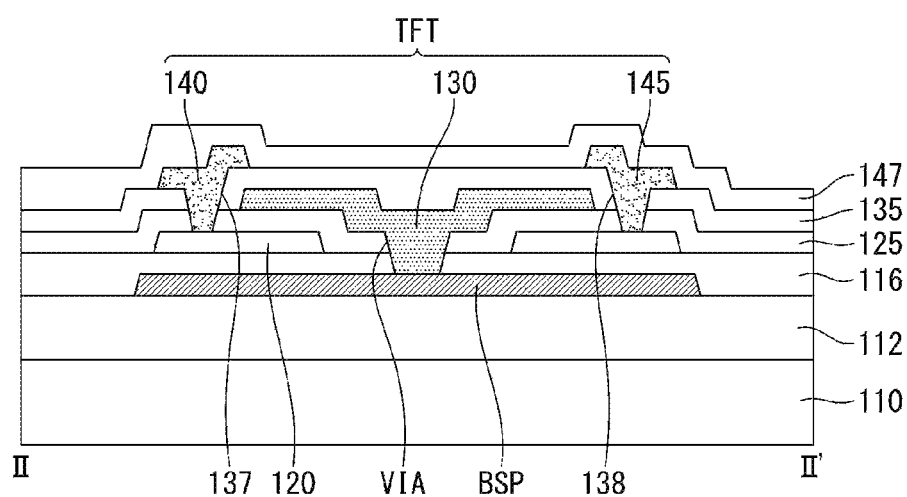
FIG. 11 is a cross-sectional view taken along line II-II' of FIG. 10.

FIG. 10 is an enlarged view of a part of an organic light emitting display device according to a third embodiment of the present disclosure. FIG. 11 is a cross-sectional view taken along line II-II' of FIG. 10.

As shown in FIG. 10, the organic light emitting display device 100 may include a gate driver GIP disposed in a bezel area B/A. The gate driver GIP of the present disclosure may be divided into a buffer part BUP, a logic part LOP, and a clock part CLP as a scan signal generator. A shield power supply line VSM is positioned in the bezel area B/A other than an area having the gate driver GIP, and a shield layer BSM is positioned in the gate driver GIP and the bezel area B/A other than the gate driver GIP. The shield power supply line VSM is disposed on one side of the gate driver GIP, and connected to the shield layer BSM through a through hole 139 in the bezel area B/A other than the gate driver GIP, respectively.

The shield layer BSM is disposed in the bezel area B/A including the gate driver GIP, and overlaps with the gate driver GIP. A shield line BSL is formed in a single line shape like the shield layer BSM of the first and second embodiments described above, and overlaps with the buffer part BUP disposed in the longitudinal direction.

In FIG. 11, the shield layer BSM includes a shield pattern BSP overlapping with the logic part LOP of the gate driver GIP and the shield line BSL overlapping with the buffer part BUP of the gate driver GIP. The shield pattern BSP has a form of a plurality of island patterns, and is electrically connected to a gate electrode 130 of a thin film transistor (TFT) of the logic part LOP. For example, a voltage of the gate electrode 130 may be applied to the shield pattern BSP to prevent a peripheral electric field from affecting an active layer 120 of the logic part LOP.

As described above, the shield pattern BSP is disposed on the logic part LOP and the shield line BSL is disposed on the buffer part BUP. Here, a connection part COP for transmitting a signal of the logic part LOP to the buffer part BUP is further provided between the logic part LOP and the buffer part BUP. The connection part COP also has a plurality of wirings like the clock part as in the second embodiment, and the plurality of wirings exist around the logic part LOP. Accordingly, when the shield layer BSM exists under the connection part COP, a parasitic capacitor is formed, and a voltage of the shield layer BSM can be varied by coupling effect depending on a voltage applied to the connection part COP.

Therefore, in this example embodiment, the shield pattern BSP and the shield line BSL are formed to be spaced apart from each other so as not to overlap with the connection part COP, particularly, the shield pattern BSP in the logic portion LOP is formed so as not to overlap with the plurality of wirings of the connection part COP, so that it is possible to prevent the voltage of the shield pattern BSP and the shield line BSL from being varied and to prevent the parasitic capacitor from being formed. In addition, because the thin film transistors (TFTs) of the logic part LOP and the buffer part BUP are overlapped with the shield layer BSM, the same effects as those of the above-described first and second embodiments can be obtained.

Fourth Embodiment

Figure 12:
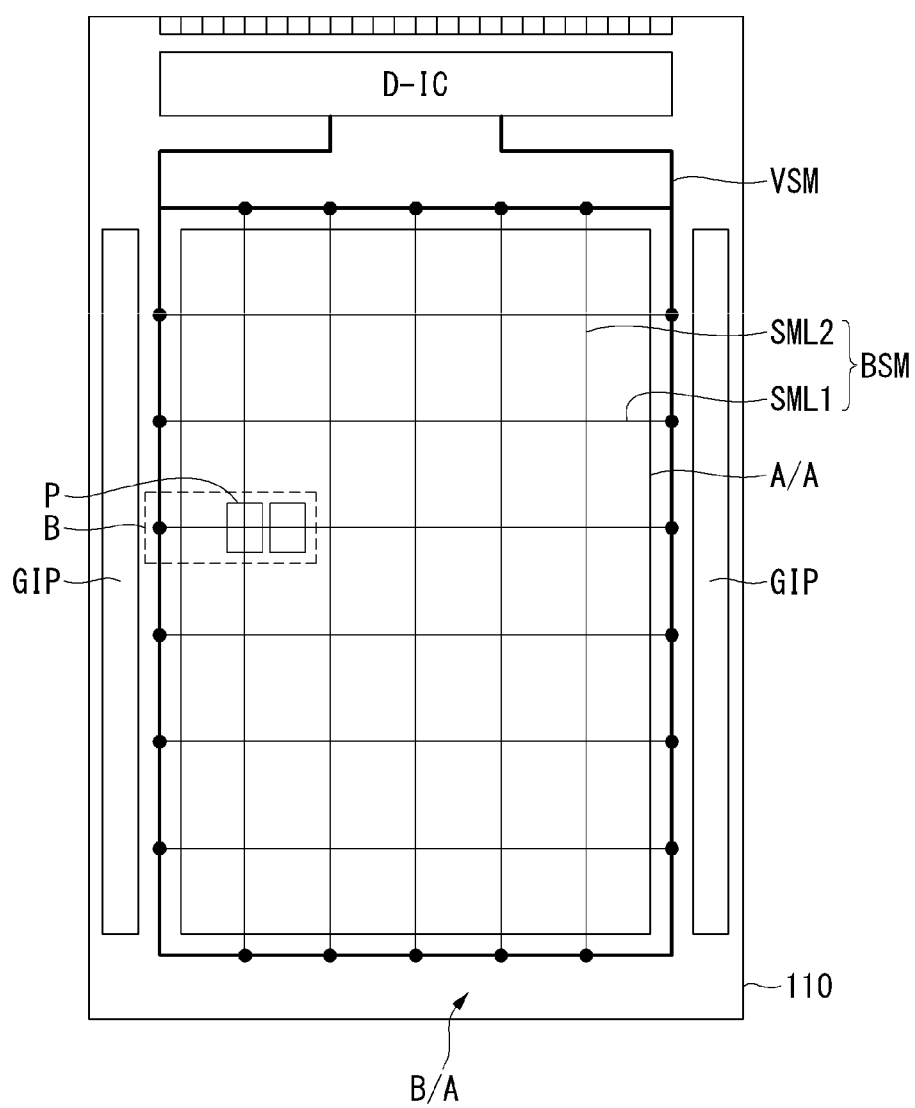
FIG. 12 is a plan view of an organic light emitting display device according to a fourth embodiment of the present disclosure.
Figure 13:
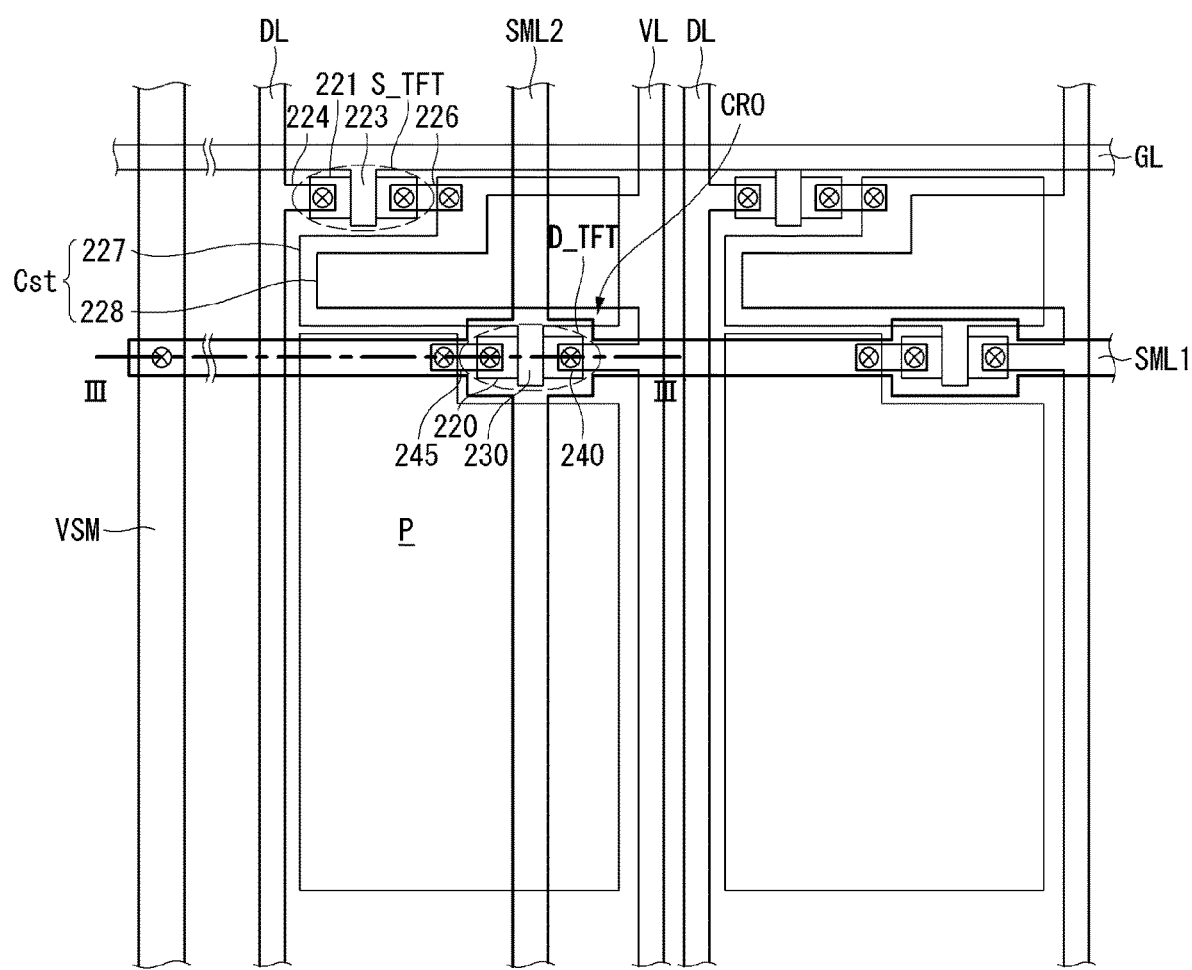
FIG. 13 is an enlarged plan view of area B in FIG. 12.
Figure 14:
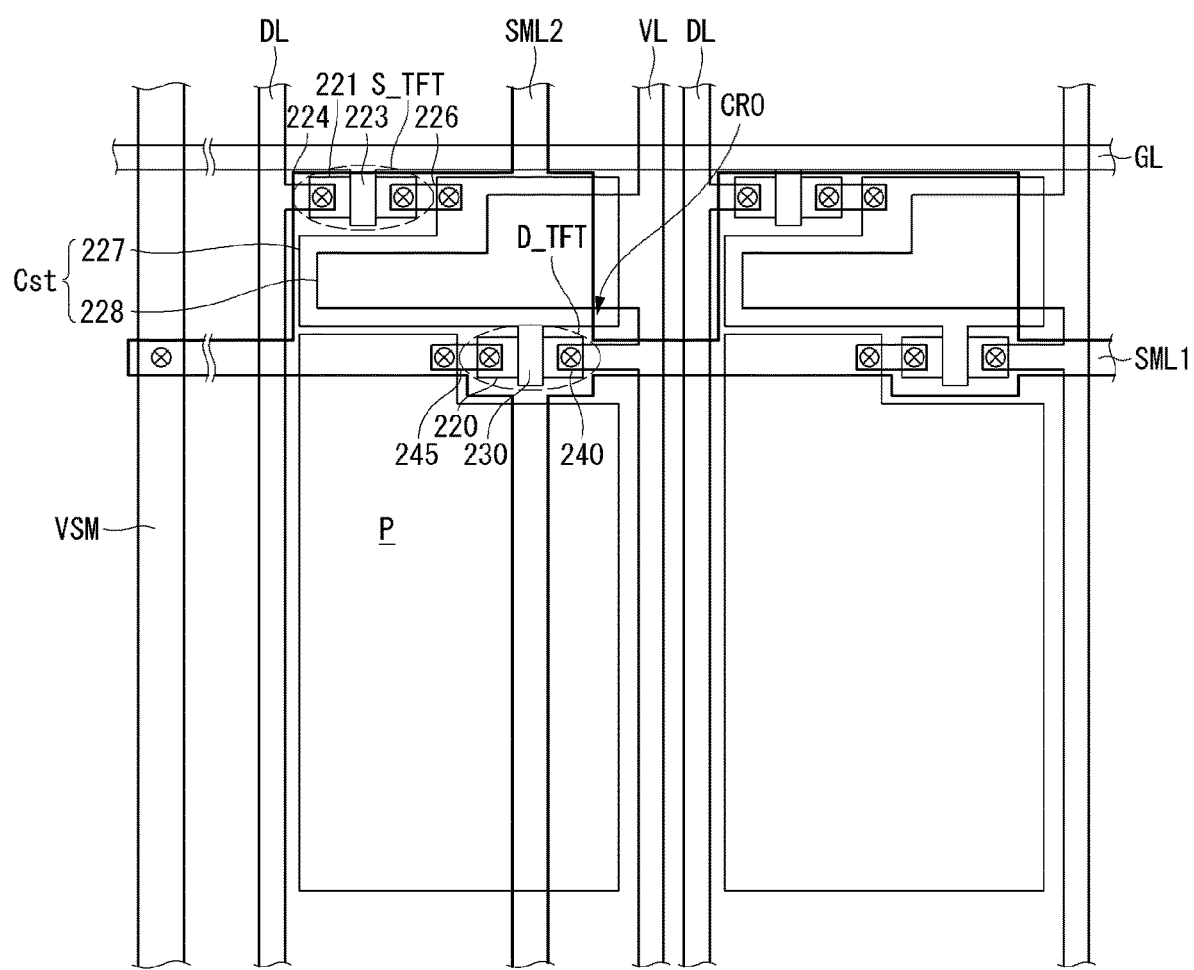
FIG. 14 is an enlarged plan view of another example of an area B in FIG. 12.
Figure 15:
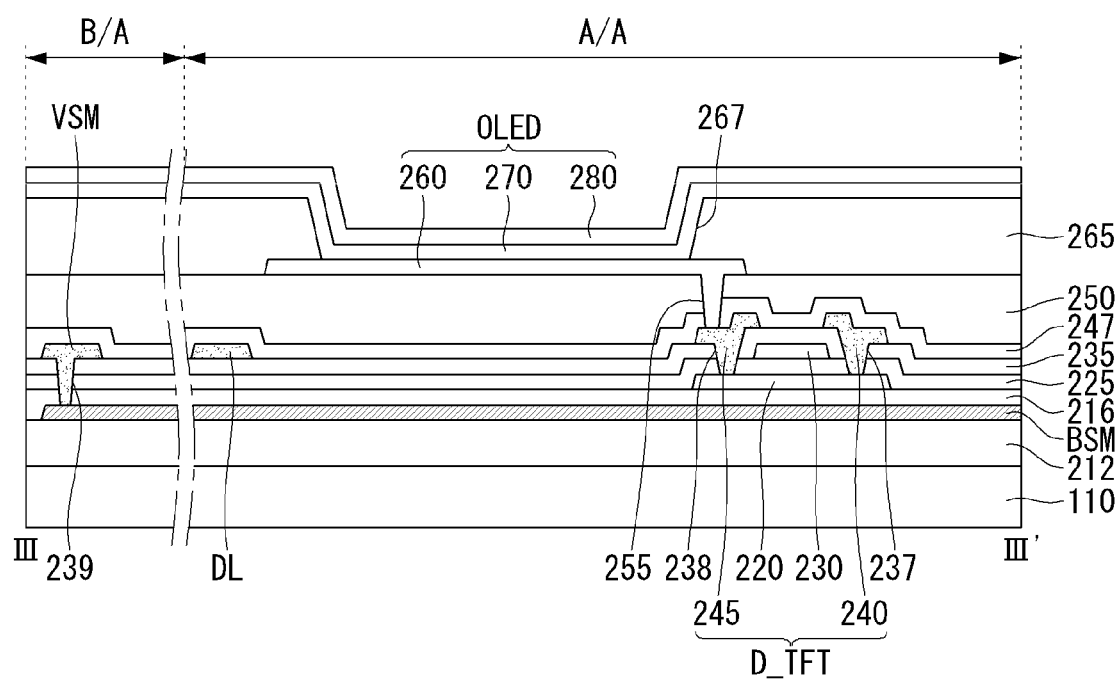
FIG. 15 is a cross-sectional view taken along line III-III' in FIG. 13.

Hereinafter, the basic structure of 2T1C shown in FIG. 2 will be described as an example. FIG. 12 is a plan view of an organic light emitting display device according to a fourth embodiment of the present disclosure. FIG. 13 is an enlarged plan view of an area B in FIG. 12. FIG. 14 is an enlarged plan view of another example of area B in FIG. 12. FIG. 15 is a cross-sectional view taken along line III-III' in FIG. 13.

As shown in FIG. 12, an organic light emitting display device 100 may include an active area A/A that implements an image on a substrate 110 and a bezel area B/A that surrounds the active area A/A. A plurality of pixels P are disposed in the active area A/A to emit light of red (R), green (G), and blue (B) to realize full color. In this example embodiment, the plurality of pixels P may be provided as cyan, magenta, and yellow pixels, but any pixel structure may be applied. The plurality of pixels P may be disposed in a stripe manner in which red (R), green (G) and blue (B) are disposed in order on one row. The plurality of pixels P may be disposed such that red (R) is disposed in one row, green (G) is disposed in the next row, and blue (B) is disposed in the next row of the green pixel. Further, one (or more) of the red (R), green (G), or blue (B) may be formed of two subpixels. Also, the plurality of pixels P may be disposed in a pentile manner. The bezel area B/A is an area surrounding the active area A/A and is an area where light is not emitted. The bezel region B/A may include a gate driver GIP, a data driver D-IC, and the like for driving elements for driving the pixels P in the active area A/A.

A shield power supply line VSM for applying power from the data driver D-IC to a shield layer BSM is positioned outside the active area A/A. The shield power supply line VSM surrounds the active area A/A and is connected to the shield layer BSM in the bezel area B/A, respectively. In FIG. 12, the shield power supply line VSM completely surrounds the active area A/A. However, the shield power supply line VSM may be disposed on at least one side of the active area A/A.

The shield layer BSM is disposed in the active area A/A and the bezel area B/A to overlap with the plurality of pixels P of the active area A/A, and in particular, is disposed to overlap with driving thin film transistors provided in the plurality of pixels P. The shield layer BSM is supplied with power from the above-described shield power supply line VSM, and prevents electrical characteristics of the driving thin film transistors from being changed. More specific operations will be described later. The shield layer BSM includes a plurality of shield lines SML1 and SML2, and includes a first shield line SML1 disposed in a horizontal direction and a second shield line SML2 disposed in a vertical direction. The shield layer BSM is disposed in a mesh shape by the plurality of first and second shield lines SML1 and SML2 being orthogonal to each other. In this example disclosure, the shield layer BSM in which a total of eleven shield lines SML1 and SML2 having the first shield line SML1 and the second shield line SML2 are disposed in a mesh shape in the active area A/A is shown. However, FIG. 12 is schematically shown for convenience of explanation, and the shield layer BSM is disposed in all the pixels P disposed in the active area A/A. It should be understood that the shield layer BSM overlaps with all the driving thin film transistors.

The shield layer BSM and the shield power supply line VSM will be described with reference to FIG. 13. As illustrated in FIG. 13, an organic light emitting display device 100 may include a gate line GL, a data line DL and a power supply line VL intersecting with the gate line GL to form one pixel P on the substrate 110. The pixel P may correspond to an inner area which is defined by intersecting the gate line GL, the data line DL and the power supply line VL. Although the figure shows that the gate line GL is not disposed at a lower portion of the pixel P, the pixel P can be defined because a gate line of an adjacent pixel exists.

In the pixel, a switching thin film transistor S_TFT, a driving thin film transistor D_TFT, and a capacitor Cst are disposed, and an organic light emitting diode (not shown) connected to the driving thin film transistor D_TFT is disposed. The switching thin film transistor S_TFT functions to select a pixel. The switching thin film transistor S_TFT includes an active layer 221, a gate electrode 223 branched from the gate line GL, a source electrode 224 branched from the data line DL, and a drain electrode 226. The capacitor Cst includes a capacitor lower electrode 227 connected to the drain electrode 226 of the switching thin film transistor S_TFT and a capacitor upper electrode 228 connected to the power supply line VL. The driving thin film transistor D_TFT serves to drive a first electrode of the pixel selected by the switching thin film transistor S_TFT. The driving thin film transistor D_TFT includes an active layer 220, a gate electrode 230 connected to the capacitor lower electrode 227, a source electrode 240 branched from the power supply line VL, and a drain electrode 245. The organic light emitting diode (not shown) includes a first electrode (not shown) connected to the drain electrode 245 of the driving thin film transistor D_TFT, an organic layer (not shown) including a light emitting layer formed on the first electrode, and a second electrode (not shown).

The shield layer BSM is disposed under the active layer 220 of the driving thin film transistor D_TFT. Specifically, an intersection CRO where the first shield line SML1 intersects with second shield line SML2 is positioned under the active layer 220. The intersection CRO of the shield layer BSM is positioned to overlap with at least an entire area of the active layer 220. On the other hand, in another adjacent pixel (a pixel disposed on the right side), the first shield line SML1 of the shield layer BSM is positioned, and the second shield line SML2 is not positioned.

In an example embodiment of the present disclosure, the first shield line SML1 and the second shield line SML2 of the shield layer BSM may be all disposed in a certain pixel P, and any one of the first shield line SML1 or the second shield line SML2 of the shield layer BSM may be disposed in any other pixel P. For example, both the first shield line and the second shield line may be disposed in a first pixel among a plurality of pixels disposed in the horizontal direction, only the first shield line may be disposed in a second pixel, and the first shield line and the second shield line may be disposed again in a third pixel. By regularizing this, one, two, or three or more pixels in which only the first shield line is disposed may be repeatedly disposed between the pixels in which the first shield line and the second shield line are disposed. However, the present disclosure is not limited to this configuration, and the first shield line and the second shield line may be disposed in various structures. If the shield layer is disposed under the driving thin film transistor of all the pixels, disposition of the first shield line and the second shield line may be arbitrary.

On the other hand, unlike FIG. 13, the shield layer BSM may overlap with the driving thin film transistor D_TFT, and the size thereof may be further enlarged.

With reference to FIG. 14, although the shield layer BSM has a size enough to cover the driving thin film transistor D_TFT in the above-described FIG. 13, the shield layer BSM may further have a size capable of covering not only the switching thin film transistor S_TFT but also the capacitor Cst. Specifically, the intersection CRO of the shield layer BSM is formed in a plate shape and overlaps with the switching thin film transistor S_TFT, the driving thin film transistor D_TFT, and the capacitor Cst. However, the intersection CRO does not overlap with the data line DL, the gate line GL, and the power supply line VL. The first shield line SML1 overlaps with the data line DL and the power supply line VL and the second shield line SML2 overlaps with the gate line GL. Therefore, parasitic capacitors generated by overlapping the shield layer BSM with the data line DL, the gate line GL, and the power source line VL can be minimized.

The shapes of the shield layer BSM shown in the fourth embodiment of the present disclosure are merely examples, and the present disclosure is not limited thereto. In the present disclosure, the size of the intersection CRO of the shield layer BSM may be any size as long as it overlaps with the driving thin film transistor D_TFT.

Hereinafter, the organic light emitting display device of the present disclosure will be described in detail with reference to FIG. 15, which is a cross-sectional view showing a structure taken along line III-III' in FIG. 13. In the following, reference numerals different from the FIG. 4 may be used, but duplicate description may be omitted.

In FIG. 15, in the organic light emitting display device 100, a driving thin film transistor D_TFT and an organic light emitting diode OLED that may be connected to the driving thin film transistor D_TFT are positioned on a substrate 110. Here, the substrate 110 includes an active area A/A and a bezel area B/A other than the active area A/A. A first buffer layer 212 is positioned on the substrate 110. A shield layer BSM is positioned on the first buffer layer 212. The shield layer BSM is positioned in the active area A/A and the bezel area B/A. A second buffer layer 216 is positioned on the shield layer BSM. A active layer 220 is positioned on the second buffer layer 216. A first insulating layer 225, which may be a gate insulating layer, is positioned on the active layer 220. A gate electrode 230 is positioned on the first insulating layer 225 at a position corresponding to a certain region of the active layer 220, for example, a channel region.

A second insulating layer 235, which may be an interlayer insulating layer, is positioned on the gate electrode 230. A part of the second insulating layer 235 and the first insulating layer 225 are etched to form contact holes 237 and 238 exposing a part of the active layer 220, for example, a source region and a drain region. A data line DL, a source electrode 240, and a drain electrode 245 are positioned on the second insulating layer 235. The source electrode 240 and the drain electrode 245 are electrically connected to the active layer 220 through the contact holes 237 and 238 passing through the second insulating layer 235 and the first insulating layer 225.

Therefore, the driving thin film transistor D_TFT including the active layer 220, the gate electrode 230, the source electrode 240, and the drain electrode 245 is formed. In the bezel area B/A, a shield power supply line VSM is positioned on the second insulating layer 235. The shield power supply line VSM is connected to the shield layer BSM through a through hole 239 passing through the second buffer layer 216, the first insulating layer 225 and the second insulating layer 235. In this example embodiment, the shield power supply line VSM is positioned in the same layer as the source electrode 240, but the shield power supply line VSM may be positioned in the same layer as the gate electrode 230.

A third insulating layer 247 is positioned on an entire surface of the substrate 110 including the driving thin film transistor D_TFT. A fourth insulating layer 250 is positioned on an entire surface of the substrate 110 including the third insulating layer 247. The third and fourth insulating layers 247 and 250 include a via hole 255 for exposing the drain electrode 245 of the driving thin film transistor D_TFT.

A first electrode 260 is positioned on the fourth insulating layer 250. The first electrode 260 fills the via hole 255 and is connected to the drain electrode 245 of the driving thin film transistor D_TFT. Here, when the organic light emitting display device 100 has a top emission structure in which light is emitted toward a second electrode 280, the first electrode 260 may further include a reflective layer and may have a two-layer structure of ITO/reflective layer or a three-layer structure of ITO/reflective layer/ITO. On the other hand, when the organic light emitting display device 100 has a bottom emission structure in which light is emitted toward the first electrode 260, the first electrode 160 may be made of a transparent conductive material.

A bank layer 265 is positioned on the substrate 110 including the first electrode 260. The bank layer 265 is provided with an opening 267 through which the first electrode 260 is exposed. An organic layer 270 is positioned on the first electrode 260 exposed by the opening 267 of the bank layer 265. The organic layer 170 may include at least a light emitting layer in which electrons and holes are combined to emit light, and at least one of a hole injection layer, a hole transport layer, an electron transport layer, and an electron injection layer. A second electrode 280 is positioned on the substrate 110 on which the organic layer 270 is formed. When the organic light emitting display device 100 of the present disclosure has a top emission structure in which light is emitted toward the second electrode 280, the second electrode 280 is thin enough to allow light to pass therethrough. In contrast, when the organic light emitting display device 100 has a bottom emission structure in which light is emitted toward the first electrode 260, the second electrode 280 may be thick enough to reflect light. Accordingly, the organic light emitting display device 100 of the present disclosure is formed by configuring the organic light emitting diode OLED including the first electrode 260, the organic layer 270, and the second electrode 280.

When power is applied to the shield layer BSM in the above-described organic light emitting display device 100, it is possible to prevent the characteristics of the driving thin film transistors D_TFT from being changed by shielding an electric field formed by the polyimide substrate 110 under the active layer 220. Unlike applying an external power to the shield layer as in the present disclosure, as another method of applying power to the shield layer, there is a method of connecting the source electrode of the thin film transistor and the shield layer and applying the source power to the shield layer. However, depending on a voltage applied to the source electrode, a difference in a voltage between the source electrode and the gate electrode occurs. In the present disclosure, power is applied to the shield layer BSM from the data driver D-IC instead of connecting the source electrode 240 and the shield layer BSM, so that it is possible to prevent the difference in the voltage between the source electrode 240 and the gate electrode 230 from occurring.

Further, in a structure for connecting the source electrode of the thin film transistor and the shield layer, because a through hole connecting the source electrode and the shield layer is formed in the pixel, a size of the pixel is increased by a size of the through hole. However, according to example embodiments of the present disclosure, the shield power supply line VSM is connected to the shield layer BSM through the through hole 239 in the outside of the active area A/A, so that it is possible to reduce a size of the pixel in the active area A/A and to design a pixel of high resolution. In addition, the number of the through holes formed in each pixel can be remarkably reduced, and process deviation can be reduced.

Further, in the structure for connecting the source electrode of the thin film transistor and the shield layer, because the voltage applied to the source electrode is limited, a voltage applied to the shield layer cannot be adjusted. However, because the power may be applied from the data driver D-IC, the voltage applied to the shield layer can be adjusted in response to the structure or the model or the panel characteristics of the NMOS or PMOS thin film transistor. Therefore, the characteristics of the thin film transistor can be optimized.

The shield layer BSM of the present disclosure may be formed in various structures. Hereinafter, various structures of the shield layer BSM will be described with reference to a fifth embodiment. In the following description, the same reference numerals are assigned to the same components as those in the fourth embodiment described above, and a description thereof will be omitted.

Fifth Embodiment

Figure 16:
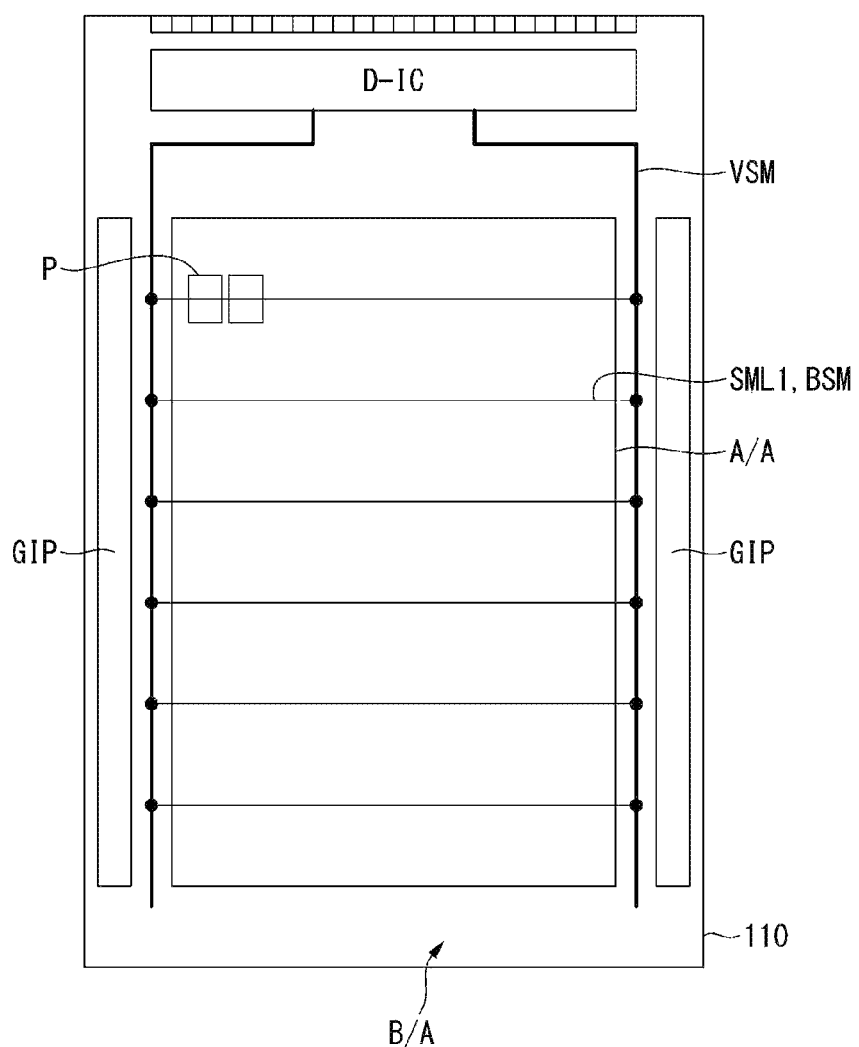
FIG. 16 is a plan view of an organic light emitting display device according to a fifth embodiment of the present disclosure.
Figure 17:
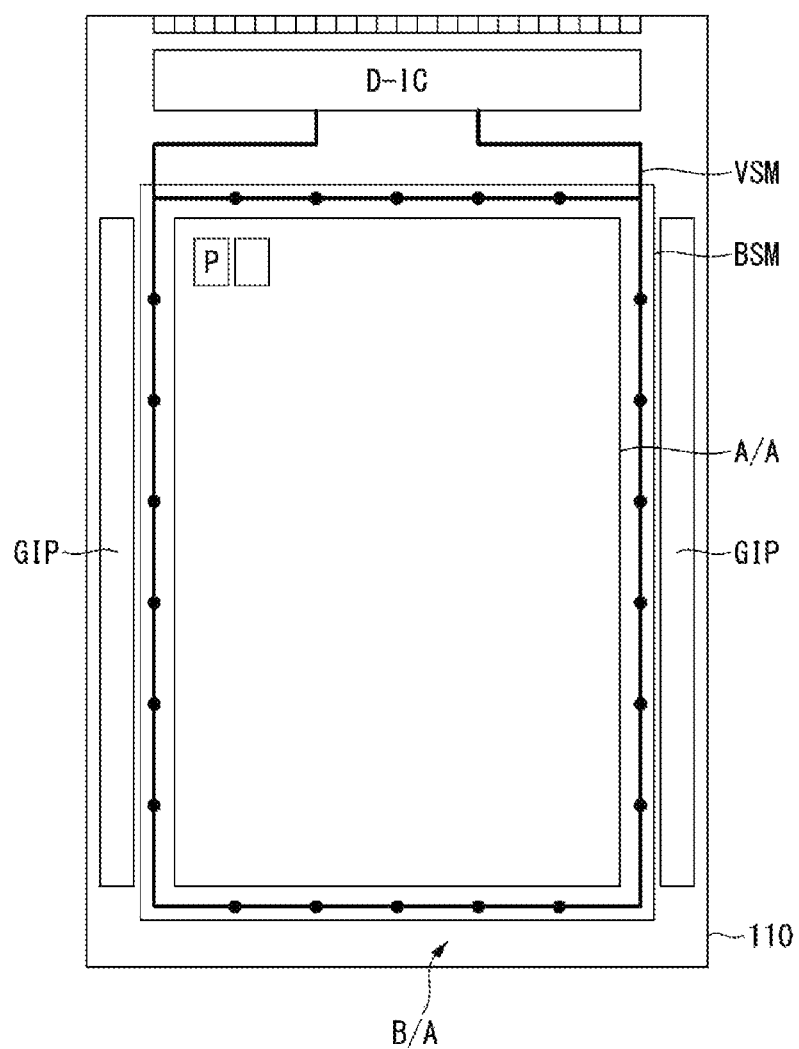
FIG. 17 is a plan view of an organic light emitting display device according to another fifth embodiment of the present disclosure.

FIG. 16 is a plan view of an organic light emitting display device according to a fifth embodiment of the present disclosure. FIG. 17 is a plan view of an organic light emitting display device according to a variation according to the fifth embodiment of the present disclosure.

With reference to FIG. 16, an organic light emitting display device 100 according to a fifth embodiment of the present disclosure includes an active area A/A that implements an image on a substrate 110 and a bezel area B/A that surrounds the active area A/A. A plurality of pixels P are disposed in the active area A/A, and a shield power supply line VSM for applying power from a data driver D-IC to a shield layer BSM is positioned outside the active area A/A. The shield power supply line VSM is disposed on both sides of the active area A/A and is connected to the shield layer BSM in the bezel area B/A, respectively.

The shield layer BSM is disposed in the active area A/A and the bezel area B/A to overlap with the plurality of pixels P of the active area A/A, and in particular, is disposed to overlap with driving thin film transistors provided in the plurality of pixels P. The shield layer BSM is supplied with power from the above-described shield power supply line VSM, and prevents electrical characteristics of the driving thin film transistors from being changed.

In this embodiment, the shield layer BSM includes a plurality of first shield lines SML1 disposed in a horizontal direction. In the shield layer BSM, the plurality of first shield lines SML1 are disposed in a stripe shape, and one side and the other side of the first shield lines SML1 are connected to the shield power supply line VSM, respectively. Here, the first shield lines SML1 may be disposed in a total of nine shield lines in the active areas A/A, however, as schematically shown for convenience of explanation, and the first shield lines SML1 may be disposed in a number that can overlap with all of the pixels disposed in the active area A/A.

On the other hand, with reference to FIG. 17, in an organic light emitting display device 100, a shield power supply line VSM for applying power from a data driver D-IC to a shield layer BSM is positioned outside an active area A/A. The shield power supply line VSM is disposed to surround the active area A/A and is connected to the shield layer BSM in a bezel area B/A, respectively.

The shield layer BSM is disposed to overlap with a plurality of pixels P of the active area A/A, and in particular, is disposed to overlap with driving thin film transistors provided in the plurality of pixels P. The shield layer BSM may be formed in a plate shape larger than the active area A/A to overlap with an entire active area A/A. Thus, the shield layer BSM is disposed in both the active area A/A and the bezel area B/A.

The organic light emitting display device according to the fifth embodiment of the present disclosure described above discloses embodiments of shield layers formed in a stripe shape and a plate shape in addition to a mesh shape. The fifth embodiment also has the same effects as those of the fourth embodiment described above, so description of detailed effects will be omitted.

Hereinafter, experimental data on characteristics of thin film transistors of gate drivers according to comparative examples and embodiments of the present disclosure will be described.

Comparative Example 1

An organic light emitting display device having a structure in which a source electrode of a thin film transistor of a gate driver is connected to a shield layer is manufactured.

Embodiment 1

An organic light emitting display device having the structure shown in FIG. 6 is manufactured.

Figure 18:
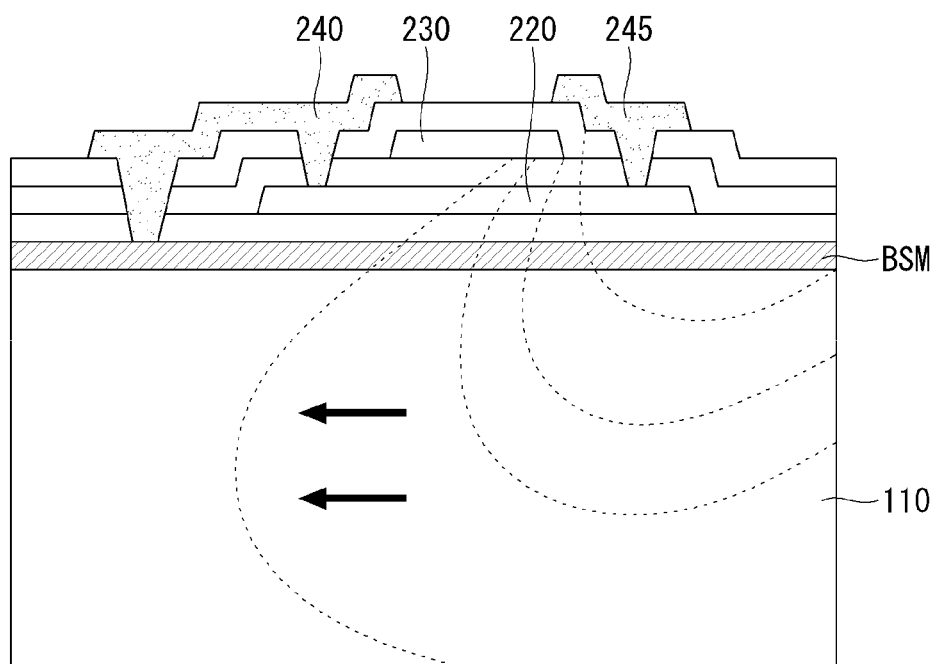
FIG. 18 is a diagram showing an electric field distribution of a thin film transistor of Comparative Example 1.
Figure 19:
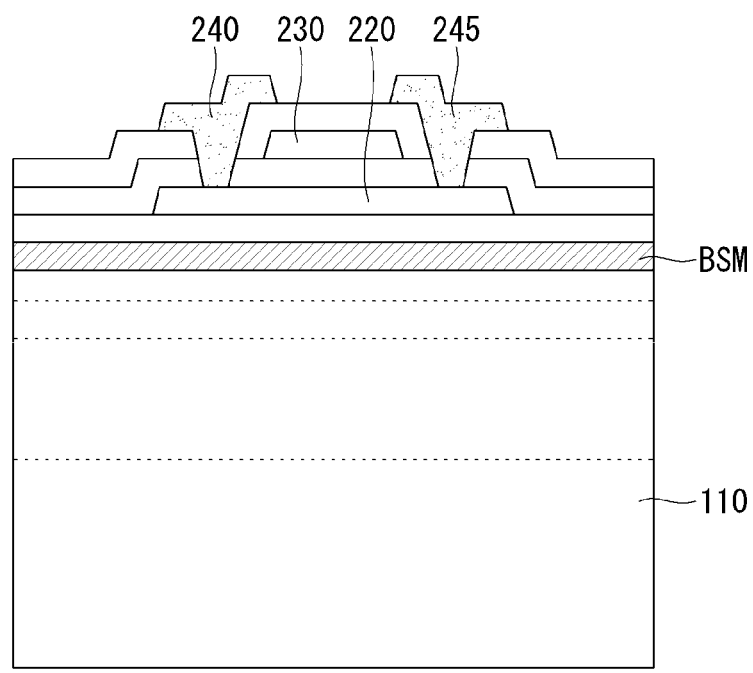
FIG. 19 is a diagram showing an electric field distribution of a thin film transistor of Embodiment 1.

Electric field distribution according to a source voltage of a thin film transistor of the organic light emitting display device manufactured according to Comparative Example 1 and Embodiment 1 described above is measured. FIG. 18 is a diagram showing an electric field distribution of a thin film transistor of Comparative Example 1. FIG. 19 is a diagram showing an electric field distribution of a thin film transistor of Embodiment 1. For reference, in FIGS. 18 and 19, dotted lines indicate electric fields having the same voltage potential.

With reference to FIG. 18, in Comparative Example 1, an electric field of a drain electrode is blocked because a source electrode is connected to a shield layer. However, as a source voltage is increased, the electric field of the drain electrode increases toward the source electrode, and different voltage potentials are applied to an active layer. For example, the shield layer of Comparative Example 1 is found not to block the electric field affecting the active layer.

On the other hand, with reference to FIG. 19, in Embodiment 1, because the shield layer covers an entire thin film transistor, the same potential is applied under the active layer even if the source voltage is increased. Through these results, in accordance with example embodiments of the present disclosure, the electric field applied to the active layer of the thin film transistor is applied to an entire active layer with the same voltage potential, so that it can be confirmed that electrical characteristics of the thin film transistor can be prevented from being changed.

Hereinafter, experimental data on characteristics of the organic light emitting display device according to Comparative Example 2 and Embodiments of the present disclosure will be described.

Comparative Example 2

An organic light emitting display device having a structure in which a source electrode of a driving thin film transistor of each pixel is connected to a shield layer is manufactured.

Embodiment 2

An organic light emitting display device having a structure in which a shield layer overlaps only with a source electrode and an active layer of a driving thin film transistor, and does not overlap with a drain electrode is manufactured.

Embodiment 3

An organic light emitting display device having the structure shown in FIG. 13 is manufactured.

Embodiment 4

An organic light emitting display device having the structure shown in FIG. 14 is manufactured.

Embodiment 5

An organic light emitting display device having the structure shown in FIG. 17 is manufactured.

In the organic light emitting display device manufactured according to the above-described Comparative Example 2 and Embodiments 2 to 5, capacitances (capacitors) between the respective components and the shield layer are measured and shown in Table 1 below (where fF is femtofarads).

TABLE 1

|  | Comparative Example 2 | Embodiment 2 | Embodiment 3 | Embodiment 4 | Embodiment 5 |
| --- | --- | --- | --- | --- | --- |
| Area ratio of shield layer in pixel | 50% | 60% | 70% | 80% | 100% |
| Data line | 8.9 fF | 9.3 fF | 8.7 fF | 13.9 fF | 19.3 fF |
| Gate line | 9.6 fF | 9.7 fF | 8.3 fF | 9.4 fF | 10.3 fF |

With reference to Table 1 above, compared with Comparative Example 2, the organic light emitting display device according to Embodiment 2 have a capacitance increased by 0.4 fF between the data line and the shield layer, and a capacitance increased by 0.1 fF between the gate line and the shield layer. Compared with Comparative Example 2, the organic light emitting display device according to Embodiment 3 have a capacitance decreased by 0.2 fF between the data line and the shield layer, and a capacitance decreased by 1.3 fF between the gate line and the shield layer. Compared with Comparative Example 2, the organic light emitting display device according to Embodiment 4 have a capacitance increased by 5.0 fF between the data line and the shield layer, and a capacitance decreased by 0.2 fF between the gate line and the shield layer. Compared with Comparative Example 2, the organic light emitting display device according to Embodiment 5 have a capacitance increased by 10.4 fF between the data line and the shield layer, and a capacitance increased by 0.7 fF between the gate line and the shield layer.

Through these results, the capacitance across each line of the organic light emitting display device according to Embodiments of the present disclosure increases somewhat compared with the Comparative Example, however, in Embodiment 3 having the mesh-shape shield layer shown in FIG. 13, it is confirmed that electrostatic capacitance across each line decreases.

Figure 20:
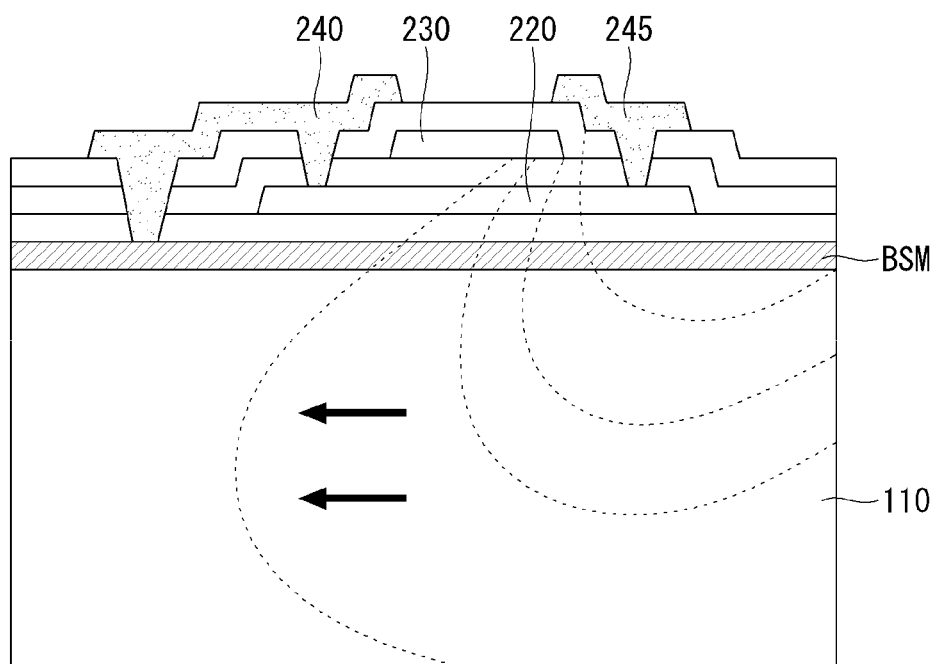
FIG. 20 is a diagram showing an electric field distribution of a driving thin film transistor of Comparative Example 2.
Figure 21:
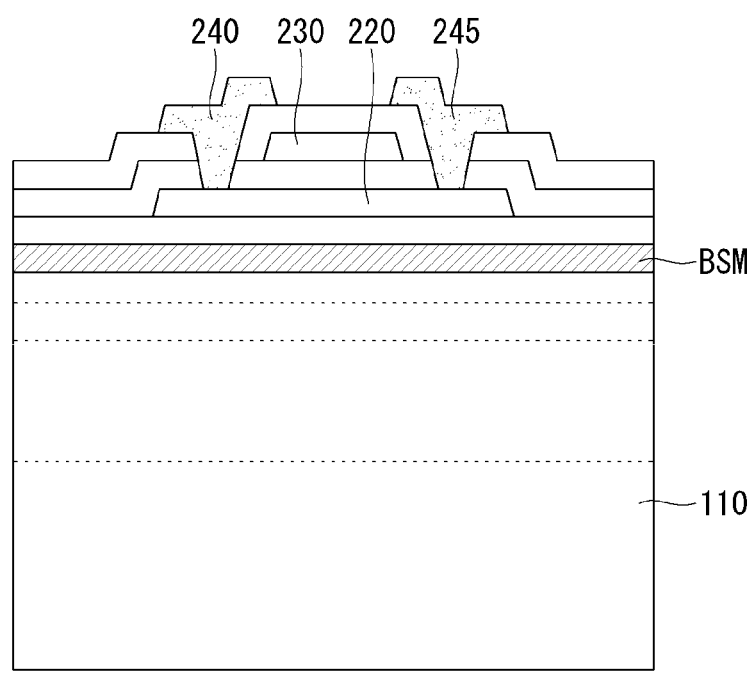
FIG. 21 is a diagram showing an electric field distribution of a driving thin film transistor of Embodiment 3.

Electric field distribution according to a source voltage of a driving thin film transistor of the organic light emitting display device according to Comparative Example 2 and Embodiment 3 described above is measured. FIG. 20 is a diagram showing an electric field distribution of a driving thin film transistor of Comparative Example 2. FIG. 21 is a diagram showing an electric field distribution of a driving thin film transistor of Embodiment 3. For reference, in FIGS. 20 and 21, dotted lines indicate electric fields having the same voltage potential.

With reference to FIG. 20, in Comparative Example 2, an electric field of a drain electrode is blocked because a source electrode is connected to a shield layer. However, as a source voltage is increased, the electric field of the drain electrode increases toward the source electrode, and different voltage potentials are applied to an active layer. For example, the shield layer of Comparative Example 2 is found not to block the electric field affecting the active layer.

On the other hand, with reference to FIG. 21, in Embodiment 3, because the shield layer covers an entire thin film transistor, the same potential is applied under the active layer even if the source voltage is increased. Through these results, in embodiments of the present disclosure, the electric field applied to the active layer of the driving thin film transistor is applied to an entire active layer with the same voltage potential, so that it can be confirmed that electrical characteristics of the driving thin film transistor can be prevented from being changed.

As described above, according to example embodiments the present disclosure, power is applied to the shield layer from the data driver to prevent a difference in a voltage between the source electrode and the gate electrode from occurring. In addition, the shield power supply line may be connected to the shield layer through the through hole in the outside of the gate driver, so that a size of the gate driver can be reduced and the number of the through holes can be remarkably reduced, thereby reducing a size of the bezel area.

In addition, power may be applied to the shield layer from the data driver to prevent a difference in a voltage between the source electrode and the gate electrode from occurring. Further, according to the present disclosure, the shield power supply line is connected to the shield layer through the through hole in the outside of the active area A/A to reduce pixel size in the active area A/A and to achieve a pixel of high resolution. In addition, the number of the through holes formed in each pixel can be remarkably reduced, and process deviation can be reduced.

Further, because the power may be applied from the data driver, the voltage applied to the shield layer can be adjusted in response to the structure or the model or the panel characteristics of the NMOS or PMOS thin film transistor. Therefore, the characteristics of the thin film transistor can be improved.

Further, the shield layer may be formed to not overlap with the clock part to prevent the voltage of the shield layer from being varied and to prevent the parasitic capacitor from being formed.

In addition, the shield pattern and the shield line may be formed to be spaced apart from each other to not overlap with the connection part of the gate driver to prevent the voltage of the shield pattern and the shield line from being varied and to prevent the parasitic capacitor from being formed.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate including an active area having a plurality of pixels and a bezel area around the active area;
a data driver on one side of the bezel area;
a gate driver on at least one side of the bezel area;
a shield power supply line extending from the data driver to at least one side of the gate driver; and
a shield layer overlapped with at least one thin film transistor of the gate driver and connected to the shield power supply line in the bezel area, wherein the gate driver includes a clock part transmitting a clock and a signal; a logic part controlling a Q node; and a buffer part outputting a scan signal, and wherein the shield layer is overlapped with the logic part and the buffer part but not the clock part.

2. The display device of claim 1, wherein the shield layer is overlapped with an entire area of the gate driver.

3. The display device of claim 1,
wherein the shield layer includes a shield pattern and a shield line, the shield pattern overlaps with the logic part, and the shield line overlaps with the buffer part.

4. The display device of claim 3, wherein the shield pattern is connected to a gate electrode of a thin film transistor disposed in the logic part and is not connected to the shield power supply line.

5. The display device of claim 4, wherein the shield line is connected to the shield power supply line.

6. The display device of claim 3, wherein the shield pattern and the shield line are spaced apart from each other.

7. The display device of claim 6, wherein the gate driver further includes a connection part connecting the logic part and the buffer part, and wherein the connection part is disposed in an area where the shield pattern and the shield line are spaced apart from each other.

8. A display device, comprising:
a substrate including an active area having a plurality of pixels and a bezel area around the active area;
a gate driver on the bezel area of the substrate and including a plurality of thin film transistors;
a shield layer between the substrate and the plurality of thin film transistors; and
a shield power supply line on the bezel area of the substrate,
wherein the shield layer is connected to the shield power supply line in the bezel area of the substrate, wherein the gate driver includes a clock part transmitting a clock and a signal; a logic part controlling a Q node; and a buffer part outputting a scan signal, and wherein the shield layer is overlapped with the logic part and the buffer part but not the clock part.

9. The display device of claim 8, wherein the plurality of thin film transistors each include an active layer, a gate electrode, a source electrode, and a drain electrode, and wherein the shield layer is positioned between the active layer and the substrate, and the shield power supply line is positioned in the same layer as the source electrode.

10. A display device, comprising:
a substrate including an active area for example a plurality of pixels and a bezel area around the active area;
a data driver on one side of the bezel area;
a shield power supply line extending from the data driver to at least one side of the active area; and
a shield layer overlapped with the active area and connected to the shield power supply line,
wherein the shield layer overlaps with at least one thin film transistor of each of the plurality of pixels, wherein the gate driver includes a clock part transmitting a clock and a signal; a logic part controlling a Q node; and a buffer part outputting a scan signal, and wherein the shield layer is overlapped with the logic part and the buffer part but not the clock part.

11. The display device of claim 10, wherein the thin film transistor is a driving thin film transistor.

12. The display device of claim 10, wherein the shield layer includes a first shield line disposed in one direction and a second shield line intersecting with the first shield line.

13. The display device of claim 12, wherein the thin film transistor is overlapped with the intersection of the first shield line and the second shield line.

14. The display device of claim 12, wherein the thin film transistor is overlapped with the first shield line, and does not overlap with the second shield line.

15. The display device of claim 12, wherein the shield layer has a mesh shape.

16. The display device of claim 10, wherein the shield power supply line is connected to the shield layer through a through hole formed in the bezel area.

17. The display device of claim 10, wherein the shield layer includes a plurality of first shield lines, each of which is disposed in a same direction such that the shield layer has a stripe shape.

18. The display device of claim 10, wherein the shield layer is formed in a plate shape such that the shield layer is larger than the active area.

19. A display device, comprising:
a substrate including an active area having a plurality of pixels and a bezel area around the active area;
at least one thin film transistor on the active area of the substrate and in each of the plurality of pixels;
a shield layer between the substrate and the at least one thin film transistor; and
a shield power supply line on the bezel area of the substrate,
wherein the shield layer is connected to the shield power supply line in the bezel area, wherein the gate driver includes a clock part transmitting a clock and a signal;

a logic part controlling a Q node; and a buffer part outputting a scan signal, and wherein the shield layer is overlapped with the logic part and the buffer part but not the clock part.

\* \* \* \* \*